(12) United States Patent
Yamauchi et al.

(10) Patent No.: US 10,957,856 B2
(45) Date of Patent: Mar. 23, 2021

(54) METHOD AND APPARATUS FOR MANUFACTURING ORGANIC EL DISPLAY PANEL

(71) Applicant: JOLED INC., Tokyo (JP)

(72) Inventors: Yasuhiro Yamauchi, Tokyo (JP); Shinichiro Ishino, Tokyo (JP); Tomohiko Oda, Tokyo (JP); Mineki Hasegawa, Tokyo (JP); Yasuhiro Sekimoto, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/295,407

(22) Filed: Mar. 7, 2019

(65) Prior Publication Data

US 2019/0280205 A1 Sep. 12, 2019

(30) Foreign Application Priority Data

Mar. 9, 2018 (JP) .............................. JP2018-043376

(51) Int. Cl.
| | |
|---|---|
| *H01L 51/00* | (2006.01) |
| *H01L 51/56* | (2006.01) |
| *H01L 51/50* | (2006.01) |
| *H01L 27/32* | (2006.01) |

(52) U.S. Cl.
CPC .......... *H01L 51/0005* (2013.01); *H01L 51/56* (2013.01); *H01L 27/3246* (2013.01); *H01L 51/5012* (2013.01); *H01L 51/5056* (2013.01); *H01L 51/5072* (2013.01); *H01L 51/5088* (2013.01); *H01L 51/5092* (2013.01)

(58) Field of Classification Search
CPC .. H01L 51/0005; H01L 51/56; H01L 27/3246
See application file for complete search history.

(56) References Cited

U.S. PATENT DOCUMENTS

| | | | |
|---|---|---|---|
| 8,828,763 B1 | 9/2014 | Lee et al. | |
| 2010/0289728 A1 | 11/2010 | Nakatani et al. | |
| 2017/0004983 A1* | 1/2017 | Madigan | ............. H01L 51/0026 |

FOREIGN PATENT DOCUMENTS

| | | |
|---|---|---|
| JP | 2007225856 | 9/2007 |
| JP | 2008130307 | 6/2008 |
| JP | 2009039615 | 2/2009 |
| JP | 2010-097956 A | 4/2010 |
| JP | 2010-115577 A | 5/2010 |
| JP | 2012-209138 A | 10/2012 |
| JP | 2012-252983 A | 12/2012 |
| JP | 2014-225432 A | 12/2014 |

* cited by examiner

*Primary Examiner* — Errol V Fernandes
(74) *Attorney, Agent, or Firm* — Chip Law Group

(57) ABSTRACT

Disclosed is a method for manufacturing an organic EL display panel in which a plurality of organic electroluminescence elements each including an organic layer are arranged on an upper side of a substrate. The method includes applying an ink obtained by dissolving or dispersing an organic material in a solvent to a preset application area over the substrate, and cooling the ink applied in the applying within a period until the ink is dried, to lower an ink temperature to a second temperature lower than a first temperature of the ink at a time of application thereof.

14 Claims, 17 Drawing Sheets

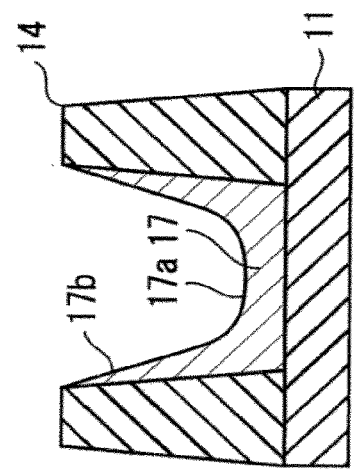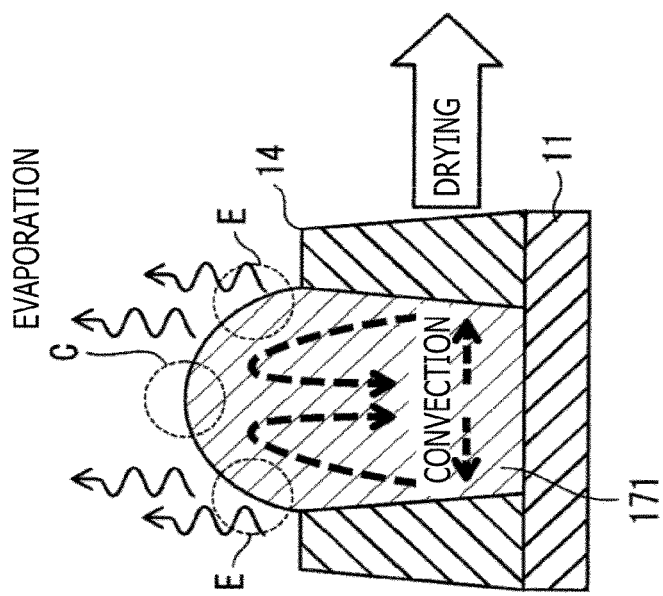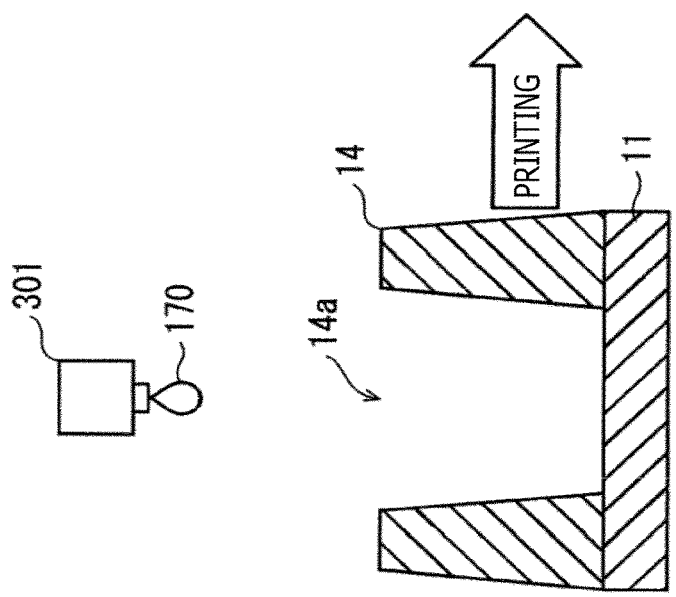

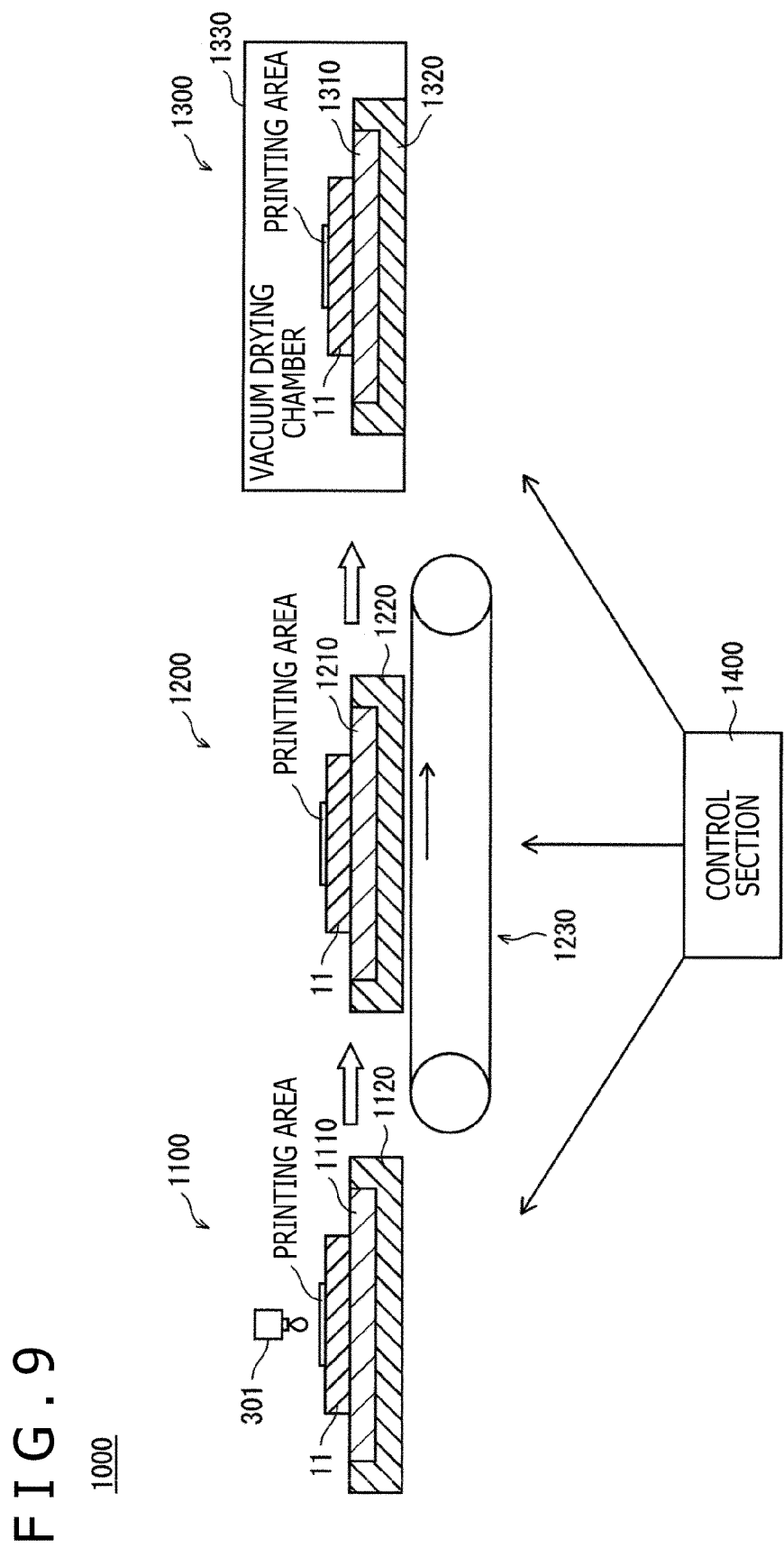

METHOD AND APPARATUS FOR MANUFACTURING ORGANIC EL DISPLAY PANEL

CROSS-REFERENCE TO RELATED APPLICATION

This application claims priority benefit of Japanese Patent Application No. JP 2018-043376 filed in the Japan Patent Office on Mar. 9, 2018. Each of the above-referenced applications is hereby incorporated herein by reference in its entirety.

BACKGROUND

The present disclosure relates to a method and apparatus for manufacturing an organic electroluminescence (EL) display panel, more particularly to a technology for forming an organic layer in a film thickness as uniform as possible by an applying (coating) system.

In recent years, developments of an organic EL display panel utilizing light emission by organic EL elements have been made vigorously. The organic EL element includes pixel electrodes (lower electrodes) on a pixel basis, organic functional layers including an organic light emitting layer, and a counter electrode (upper electrode) common for a plurality of organic EL elements, which are sequentially provided over a substrate, and holes and electrons supplied from the pixel electrodes and the counter electrode are recombined in the organic light emitting layer, whereby an organic light emitting material emits light.

Hitherto, the organic light emitting layer in the organic EL display panel has often been formed by a dry process such as vacuum deposition. In recent years, however, attendant on the progress of applying (coating) technology, a technology of forming the organic light emitting layer by a wet process has been spreading.

The wet process is a process in which a solution obtained by dissolving or dispersing an organic light emitting material in an organic solvent (the solution will hereinafter be referred to simply as "ink") is applied to required parts by an applying (coating) device, and is dried to form the organic light emitting layer. The wet process is advantageous on a cost basis in that equipment cost can be suppressed, even in the case of manufacturing a large-type organic EL display panel, and material utilization factor is high.

Examples of the related-art documents include Japanese Patent Laid-Open Nos. 2010-97956, 2012-209138, 2014-225432, and 2010-115577.

However, in order to define pixels while avoiding mixing of inks containing different organic light emitting materials, banks are provided on a substrate. If an ink is applied to an application area surrounded by the banks and is dried as it is, the ink portions in contact with side surfaces of the banks would rise, and a central portion of the organic light emitting layer would be formed in a recessed shape. Thus, it is difficult to make uniform the film thickness of the organic light emitting layer formed inside of the banks.

Therefore, uniformity of light emission in the pixel of the organic light emitting layer may be spoiled, possibly leading to a lowering in light emitting efficiency, deterioration of image quality, and a shortening of the useful life of the organic EL display panel itself.

This problem can be generated in the formation of not only the organic light emitting layer but also other organic layers such as a hole injection layer, a hole transport layer, an electron transport layer, and an electron injection layer, by the wet process.

SUMMARY

The present disclosure has been made in consideration of the above-mentioned circumstances. Accordingly, it is desirable to provide a method for manufacturing an organic EL display panel by which organic layers can be formed by a wet process in film thicknesses as uniform as possible, and it is possible to restrain a lowering in light emission efficiency, deterioration of image quality, and a shortening of the useful life, and a manufacturing apparatus directly used for carrying out the method.

According to a mode of the present disclosure, there is provided a method of manufacturing an organic EL display panel in which a plurality of organic EL elements each including an organic layer are arranged on an upper side of a substrate, the method including: applying an ink obtained by dissolving or dispersing an organic material in a solvent to a preset application area over the substrate; and cooling the ink applied in the applying within a period until the ink is dried, to lower an ink temperature to a second temperature lower than a first temperature of the ink at a time of application thereof.

In addition, according to another mode of the present disclosure, there is provided an apparatus for manufacturing an organic EL display panel in which a plurality of organic EL elements each including an organic layer are arranged on an upper side of a substrate, the apparatus including: an applying section that applies an ink obtained by dissolving or dispersing an organic material in a solvent to a preset application area over the substrate; and a cooling section that cools the ink applied by the applying section within a period until the ink is dried, to lower an ink temperature to a second temperature lower than a first temperature of the ink at a time of application thereof.

According to the method and apparatus for manufacturing an organic EL display panel of the present disclosure, even in the case of forming organic layers by a wet process, the film thicknesses of the organic layers can be as uniform as possible, and it is possible to provide an organic EL display panel in which a lowering in light emission efficiency, deterioration of image quality, and a shortening of the useful life can be restrained.

BRIEF DESCRIPTION OF THE DRAWINGS

FIGS. 7A, 7B and 7C are schematic drawings for illustrating a formation process of a light emitting layer in the related art method of manufacturing an organic EL element;

FIG. 9 is a schematic view illustrating the configuration of a light emitting layer forming apparatus according to an embodiment of the present disclosure;

DETAILED DESCRIPTION OF THE PREFERRED EMBODIMENTS

Figure 1:
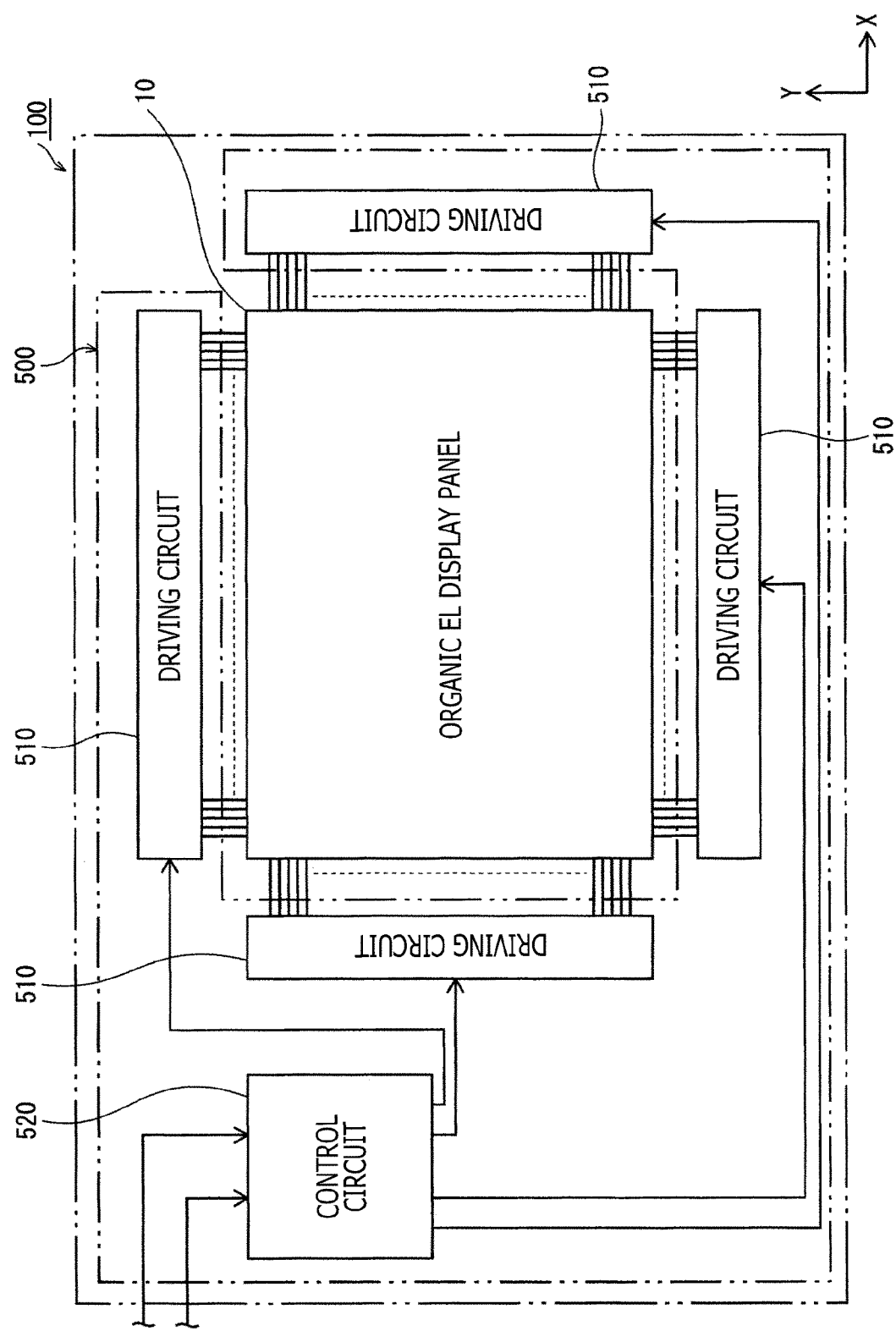
FIG. 1 is a plan view illustrating the configuration of an organic EL display device on which an organic EL display panel is mounted.

<<How One Mode of the Present Disclosure Has Been Reached>>

An organic light emitting layer in an organic EL display panel has often been formed by a dry process such as vacuum deposition. Attendant on the progress of an applying technology (coating technology), however, developments have been under way to form an organic light emitting layer by a wet process which is superior to the dry process in terms of manufacturing cost.

However, at the time of forming an organic light emitting layer by the wet process as aforementioned, an ink would come into a film shape of rising along side surfaces of banks and being recessed in a central area, so that it is difficult to make uniform the film thickness of the ink.

In order to avoid such a phenomenon, contrivances for restraining the applied ink from rising along the side surfaces of the banks have hitherto been made, such as giving a repellent property to the side surfaces of the banks (for example, Japanese Patent Laid-Open No. 2010-97956), or causing the side walls of the banks to be inclined toward the light emitting layer side (reverse taper) (for example, Japanese Patent Laid-Open No. 2012-209138). Even according to such contrivances, however, it has not yet been achieved to sufficiently make uniform the film thickness of the light emitting layer.

Particularly, in recent years, demand for higher resolution of displayed images have become stronger, and the width of one pixel has been narrowed more. On the other hand, such an improvement as to lessen the ink portions (pixel portions) rising along the side surfaces of banks (hereinafter referred to as "the rising portions") has not been made so much. As a result, the proportion of the rising portions in one pixel would increase, and the uniformity of the film thickness of the light emitting layer would be further deteriorated.

The present inventor made extensive and intensive researches for enhancing the uniformity of the film thickness of a light emitting layer formed by the wet process; as a result of the researches, the inventor has found out that convection is generated in the inside of the ink in the period from the application of the ink onto a substrate to the drying of the ink, and that the convection is a large detrimental factor with respect to uniformization of the film thickness.

Specifically, when an ink is applied to an application region surrounded by banks, a solvent is gradually evaporated from the surface of the ink. In this case, since the evaporation rate varies on a partial basis, the density of the ink becomes nonuniform, convection is generated in the applied ink, and, due to the convection, forces act on the ink such as to press the ink against the bank side surfaces. If drying of the ink progresses under this condition, the amount of the ink rising along and adhering to the bank side surfaces increases, and the amount of the ink in a central area is accordingly reduced to cause the ink to be hollowed in a recessed shape, leading to a nonuniform film thickness of the organic light emitting layer after drying. This has been found by the present inventor. For restraining this phenomenon and for making uniform, as much as possible, the film thickness of an organic layer, particularly a light emitting layer, formed by a wet process, the present inventor has reached one mode of the present disclosure.

<<Summary of one Mode of the Present Disclosure>>

A method for manufacturing an organic EL display panel according to one mode of the present disclosure is a method of manufacturing an organic EL display panel in which a plurality of organic EL elements each including an organic layer are arranged on an upper side of a substrate, the method including: an applying step of applying an ink obtained by dissolving or dispersing an organic material in a solvent to a preset application area over the substrate; and a cooling step of cooling the ink applied in the applying step within a period until the ink is dried, to lower an ink temperature to a second temperature lower than a first temperature of the ink at the time of application thereof.

According to such a mode, the applied ink is dried in a state in which the viscosity of the ink is enhanced and convection of the ink is restrained, whereby the rising portions in film formation can be lessened, and, therefore, the film thickness of the organic layer can be made uniform.

As another mode of the present disclosure, the second temperature in the above-mentioned mode is preferably lower than the first temperature by not less than 10° C.

In addition, the second temperature is preferably equal to or lower than 5° C.

With the second temperature set as above-mentioned, it is possible to suppress convection of the ink more effectively, and to realize uniformization of the film thickness of the organic layer.

As a further mode of the present disclosure, the cooling step in the above-mentioned mode preferably includes cooling the applied ink simultaneously with the application thereof.

According to such a mode, the convection in the applied ink is effectively restrained at an initial stage.

As yet another mode of the present disclosure, the applying step in the above-mentioned mode may include a carrying step of carrying the substrate coated with the ink to a later-stage device, and the cooling step may include cooling the applied ink during when the substrate is carried in the carrying step.

Besides, as a yet further mode, the method may include a drying step of drying the applied ink in a drying section, and a carrying step of carrying the substrate from a position at which the ink is applied in the applying step to a position of the drying step, and the cooling step may include cooling the applied ink during when the substrate is carried in the carrying step and/or during when the ink is dried in the drying step.

By thus cooling the ink in the carrying step and/or the drying step, also, convection of the ink can be restrained.

As still another mode of the present disclosure, the drying section in the above-described mode is preferably a vacuum drying device. According to such a configuration, the solvent in the ink can be speedily evaporated to thereby form the organic film.

As a still further mode of the present disclosure, the organic layer in the above-mentioned mode includes at least one of an organic light emitting layer, a hole injection layer, a hole transport layer, an electron injection layer, and an electron transport layer.

Where the above-mentioned manufacturing method is adopted at the time of forming at least one of the organic light emitting layer, the hole injection layer, the hole transport layer, the electron injection layer, and the electron transport layer, it is thereby possible to realize uniformization of the film thickness and to provide a high-quality organic EL display panel.

In addition an organic EL display panel manufacturing apparatus according to another mode of the present disclosure is an apparatus for manufacturing an organic EL display panel in which a plurality of organic EL element each including an organic layer are arranged on an upper side of a substrate, the apparatus including: an applying section that applies an ink obtained by dissolving or dispersing an organic material in a solvent to a preset application area over the substrate; and a cooling section that cools the ink applied by the applying section within a period until the ink is dried, to lower an ink temperature to a second temperature lower than a first temperature of the ink at a time of application thereof.

As a further mode of the present disclosure, the second temperature in the above-mentioned mode is preferably lower than the first temperature by not less than 10° C.

Besides, as yet another mode of the present disclosure, the second temperature in the above-mentioned mode is preferably equal to or lower than 5° C.

As a yet further mode of the present disclosure, the cooling section in the above-mentioned mode may cool the applied ink simultaneously with the application thereof.

As still another mode of the present disclosure, the cooling section in the above-mentioned mode may include a cooling plate and may cool the applied ink through the substrate by placing the substrate on the cooling plate.

As a still further mode of the present disclosure, the apparatus in the above-mentioned mode may include a carrying section that carries the substrate coated with the ink by the applying section to a later-stage device. The cooling section may cool the applied ink during when the substrate is carried by the carrying section.

As another mode of the present disclosure, the apparatus in the above-mentioned mode may include a drying section that dries the ink applied by the applying section, and a carrying section that carries the substrate from the applying section to the drying section. The cooling section may cool the applied ink during when the substrate is carried by the carrying section and/or during when the ink is dried by the drying section.

As a further mode of the present disclosure, the drying section in the above-mentioned mode may include a vacuum drying device.

As yet another mode of the present disclosure, the organic layer in the above-mentioned mode may include at least one of an organic light emitting layer, a hole injection layer, a hole transport layer, an electron injection layer, and an electron transport layer.

According to such an apparatus for manufacturing the organic EL display panel, it is possible, by carrying out the above-mentioned method of manufacturing the organic EL display panel, to make uniform the film thickness of the organic layer as much as possible and to provide a high-quality organic EL display panel.

Note that the expression "on" in the above-described modes of the present disclosure does not refer to the upper direction (vertically upper side) in absolute space recognition, but is defined by a relative positional relation based on the stacking order in the stack structure of the organic EL display panel. Specifically, in the organic EL display panel, a direction which is perpendicular to the main surface of the substrate and which is on the side of being directed from the substrate toward the stacked matter side is made to be the upper direction. In addition, in the case of an expression "over the substrate," it does not refer to only a region in direct contact with the substrate, but includes regions located on the upper side of the substrate through a stacked matter.

Embodiment

A method and an apparatus for manufacturing an organic EL display panel according to one mode of the present disclosure will be described below, referring to the drawings. Note that the drawings include schematic ones, and the contraction scale, the aspect ratio and the like of the members may differ from the actual ones.

1. General Configuration of Organic EL Display Device

FIG. 1 is a block diagram illustrating the general configuration of an organic EL display device 100 on which is mounted an organic EL display panel 10 as an object of manufacture by the method of manufacturing an organic EL display panel according to an embodiment of the present disclosure.

The organic EL display device 100 is a display device used, for example, for television sets, personal computers, business-use displays (electronic signboards and large-type screens for commercial facilities) and the like.

The organic EL display device 100 includes an organic EL display panel 10, and a driving control section 500 electrically connected thereto.

In the present embodiment, the organic EL display panel 10 is a top emission type display panel in which an upper surface is a rectangular image display surface. In the organic EL display panel 10, a plurality of organic EL elements (not illustrated) are arranged along the image display surface, and images are displayed by combinations of light emission from the organic EL elements. Note that the organic EL display panel 10 adopts an active matrix system as an example.

The driving control section 500 includes driving circuits 510 connected to the organic EL display panel 10, and a control circuit 520 connected to an external device such as a computer or a reception device. The driving circuit 510 includes a power source circuit for supplying electric power to each organic EL element, a signal circuit for impressing a voltage signal for controlling the electric power supplied to each organic EL element, a scanning circuit for changing over the part of impression of the voltage signal at predetermined intervals, and the like.

The control circuit 520 controls operations of the driving circuits 510 according to data inclusive of image information inputted from the external device or reception device.

Note that the four driving circuits 510 are arranged in the periphery of the organic EL display panel 10 as an example in FIG. 1, the configuration of the driving control section 500 is not limited to this configuration, and the number and positions of the driving circuits 510 may be changed as required. In addition, in the following, for convenience of description, as depicted in FIG. 1, the direction along the long sides of the upper surface of the organic EL display panel 10 will be an X direction, and the direction along short sides of the upper surface of the organic EL display panel 10 will be a Y direction.

2. Configuration of Organic EL Display Panel

In the organic EL display panel 10, one pixel includes three sub-pixels which emit light in red (R), green (G), and blue (B), respectively. Each of the sub-pixels includes an organic EL element that emits light in the corresponding color.

Since the organic EL elements for the respective colors have substantially the same configurations, they are referred to as the organic EL elements 1 when not discriminated from one another.

Figure 2:
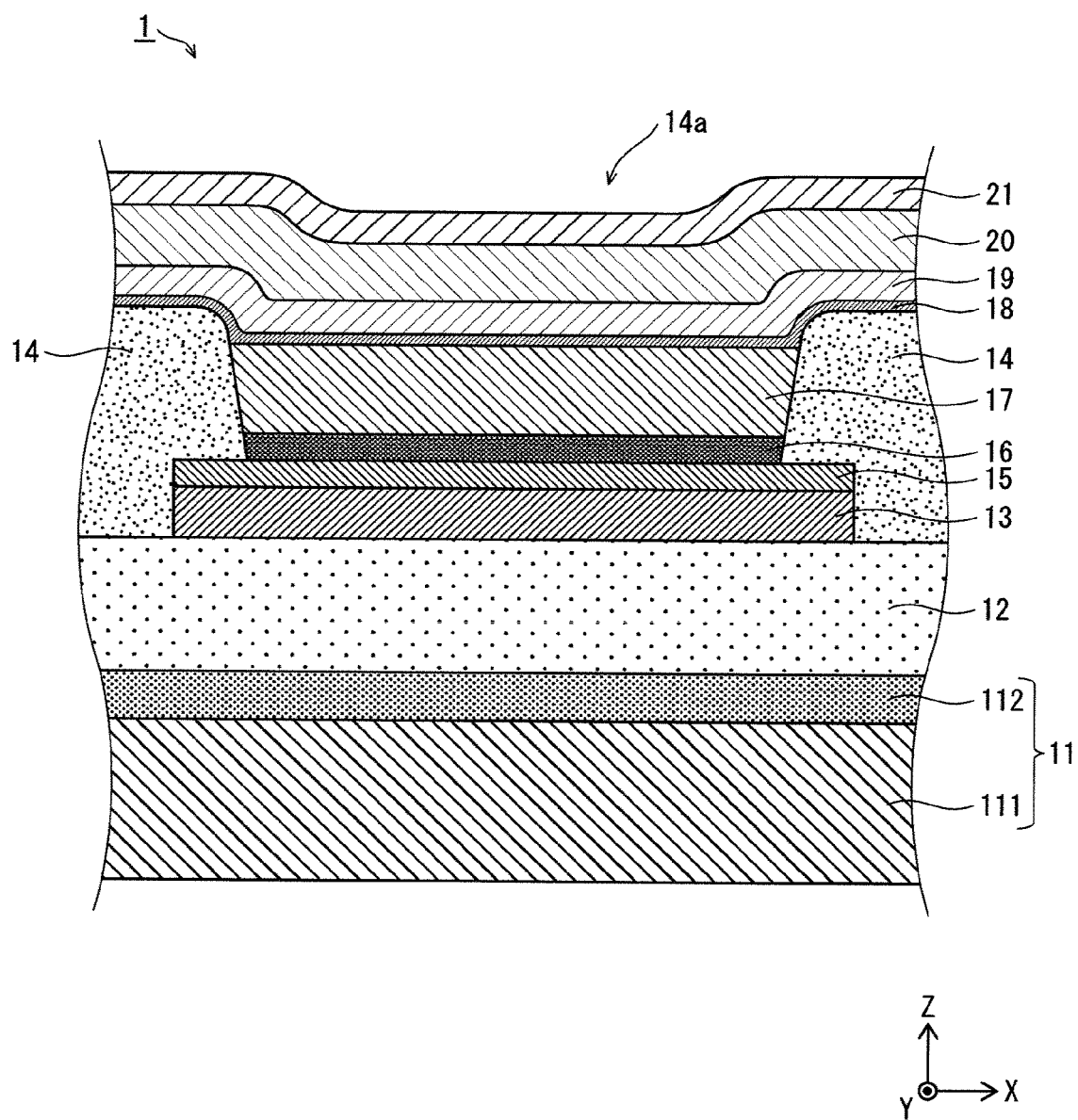
FIG. 2 is a sectional view illustrating schematically a stack structure of an organic EL element in the organic EL display panel.

FIG. 2 is a partial sectional view illustrating schematically a stack structure of one organic EL element 1. As illustrated in the figure, the organic EL element 1 includes a substrate 11, an inter-layer insulating layer 12, a pixel electrode 13, banks 14, a hole injection layer 15, a hole transport layer 16, a light emitting layer 17, an electron transport layer 18, an electron injection layer 19, a counter electrode 20, and a sealing layer 21.

The substrate 11, the inter-layer insulating layer 12, the electron transport layer 18, the electron injection layer 19, the counter electrode 20, and the sealing layer 21 are not formed on a pixel basis but are formed in common for the plurality of organic EL elements 1 possessed by the organic EL display panel 10.

(1) Substrate

The substrate 11 includes a base material 111 which is an insulating material, and a thin film transistor (TFT) layer 112. The TFT layer 112 is formed with driving circuits on a sub-pixel basis. As the base material 111, there can be used, for example, glass substrate, quartz substrate, silicon substrate, metallic substrates of molybdenum sulfide, copper, zinc, aluminum, stainless steel, magnesium, iron, nickel, gold, silver or the like, semiconductor substrates of gallium arsenide or the like, plastic substrates, and the like.

As the plastic material, either of thermoplastic resins and thermosetting resins may be used. Examples of such resins include polyethylene, polypropylene, polyamides, polyimides (PI), polycarbonate, acrylic resin, polyethylene terephthalate (PET), polybutylene terephthalate, polyacetal, fluororesins, various thermoplastic elastomers based on styrene, polyolefin, polyvinyl chloride, polyurethane, fluororubber, chlorinated polyethylene, or the like, epoxy resins, unsaturated polyesters, silicone resins, polyurethane, and the like, or copolymers, blends, polymer alloys and the like containing these as main ingredient, and laminates of one or more of these can be used.

(2) Inter-Layer Insulating Layer

The inter-layer insulating layer 12 is formed on an upper side of the substrate 11. The inter-layer insulating layer 12 is formed using a resin material, and is for flattening steps present in an upper surface of the TFT layer 112. Examples of the resin material include positive-type photosensitive materials. Besides, examples of such photosensitive materials include acrylic resins, polyimide resins, siloxane resins, and phenolic resins. In addition, though not depicted in the sectional view in FIG. 2, the inter-layer insulating layer 12 is formed with contact holes on a sub-pixel basis.

(3) Pixel Electrode

The pixel electrode 13 includes a metallic layer formed using a light-reflective metallic material, and is formed on an upper side of the inter-layer insulating layer 12. The pixel electrodes 13 are provided on a sub-pixel basis, and are each electrically connected to the TFT layer 112 through the contact hole (not illustrated).

In the present embodiment, the pixel electrode 13 functions as an anode.

Specific examples of the light-reflective metallic material include Ag (silver), Al (aluminum), aluminum alloys, Mo (molybdenum), APC (an alloy of silver, palladium, and copper), ARA (an alloy of silver, rubidium, and gold), MoCr (an alloy of molybdenum and chromium), MoW (an alloy of molybdenum and tungsten), and NiCr (an alloy of nickel and chromium).

The pixel electrode 13 may include the metallic layer solely, but may have a stack layer structure in which a layer of a metallic oxide such as ITO (indium tin oxide) or IZO (indium zinc oxide) is stacked on an upper side of the metallic layer.

(4) Bank

The banks 14 are formed on an upper side of the hole injection layer 15 in a state in which partial regions on the upper side of the pixel electrode 13 and the hole injection layer 15 are exposed and the surrounding regions are covered. A region (opening area 14a) which is not covered by the bank 14 is present on the upper side of the hole injection layer 15.

In the present embodiment, the bank 14 is formed on an upper side of the inter-layer insulating layer 12, in areas where the pixel electrode 13 is not formed. In other words, in the areas where the pixel electrode 13 is not formed, a bottom surface of the bank 14 is in contact with an upper surface of the inter-layer insulating layer 12. The banks 14 function as a structure for preventing an applied ink from overflowing, in the case where the light emitting layer 17 is formed by an applying method (coating method).

The banks 14 are formed using a material such as, for example, an insulating organic material (e.g., acrylic resins, polyimide resins, siloxane resins, or phenolic resins). In the present embodiment, a phenolic resin is used for forming the banks 14.

(5) Hole Injection Layer

The hole injection layer 15 is provided on an upper side of the pixel electrode 13 for the purpose of accelerating injection of holes from the pixel electrode 13 into the light emitting layer 17. The hole injection layer 15 is a layer formed using an oxide of Ag (silver), Mo (molybdenum), Cr (chromium), V (vanadium), W (tungsten), Ni (nickel), or Ir (iridium), or a conductive polymer material such as PEDOT (a mixture of polythiophene and polystyrenesulfonic acid).

Among the above-mentioned, a hole injection layer 15 formed using a metal oxide has a function of generating holes stably or assisting generation of holes and injecting the holes into the light emitting layer 17, and has a great work function.

In the present embodiment, the hole injection layer 15 is formed using tungsten oxide. Where the hole injection layer 15 is formed using an oxide of a transition metal, it takes a plurality of oxidation numbers, and can take a plurality of levels, resulting in that hole injection is facilitated, which contributes to a reduction in driving voltage.

(6) Hole Transport Layer

The hole transport layer 16 has a function of transporting the holes injected from the hole injection layer 15 to the light emitting layer 17. The hole transport layer 16 is formed, for example, by a wet process using a polymer compound such as polyfluorene or its derivatives, polyallylamines or their derivatives, etc. which does not have a hydrophilic group.

(7) Light Emitting Layer

The light emitting layer 17 is formed in the opening area 14a, and has a function of emitting light in each of R, G, and B through recombination between holes and electrons.

As the material for the organic light emitting layer, known materials can be utilized. Specifically, the organic light emitting layer is preferably formed using a fluorescent material such as, for example, oxynoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, Rhodamine compounds, chrysene compounds, phenanthrene compounds, cyclopentadiene compounds, stilbene compounds, diphenyl quinone compounds, styryl compounds, butadiene compounds, dicyanomethylenepyran compound, dicyanomethylenethiopyran compounds, fluorescein compound, pyrylium compound, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of a Schiff salt and a Group III metal, oxine metal complexes, and rare earth complexes.

(8) Electron Transport Layer

The electron transport layer 18 has a function of transporting the electrons from the counter electrode 20 to the light emitting layer 17. The electron transport layer 18 is formed using an organic material which has a high electron transporting property and which does not contain any alkali metal or alkaline earth metal.

Examples of the organic material used for the electron transport layer 18 include π-electron low-molecular organic materials such as oxadiazole derivatives (OXD), triazole derivatives (TAZ), and phenanthroline derivatives (BCP and Bphen).

(9) Electron Injection Layer

The electron injection layer 19 has a function of injecting the electrons supplied from the counter electrode 20 to the light emitting layer 17 side. The electron injection layer 19 is formed, for example, using a material obtained by doping a highly electron-transporting organic material with a doping metal selected from alkali metals and alkaline earth metals.

The metals corresponding to the alkali metals are lithium (Li), sodium (Na), potassium (K), rubidium (Rb), cesium (Cs), and francium (Fr), while the metals corresponding to the alkaline earth metals are calcium (Ca), strontium (Sr), barium (Ba), and radium (Ra).

In the present embodiment, barium (Ba) is used for doping.

In addition, examples of the organic material used for the electron injection layer 19 include π-electron low-molecular organic materials such as oxadiazole derivatives (OXD), triazole derivatives (TAZ), and phenanthroline derivatives (BCP and Bphen).

(10) Counter Electrode

The counter electrode 20 is formed using a light-transmitting conductive material, and is formed on an upper side of the electron injection layer 19. The counter electrode 20 functions as a cathode.

As the material for the counter electrode 20, there can be used, for example, ITO, IZO and the like. Alternatively, a metal such as silver, silver alloys, aluminum, and aluminum alloys may be used as the material for the counter electrode 20. In this case, since the counter electrode 20 should transmit light therethrough, it is formed as a thin film of not more than approximately 20 nm in thickness.

(11) Sealing Layer

The sealing layer 21 is provided for preventing the organic layers such as the hole transport layer 16, the light emitting layer 17, the electron transport layer 18, and the electron injection layer 19 from being deteriorated due to exposure to moisture or air.

The sealing layer 21 is formed using a light-transmitting material such as, for example, silicon nitride (SiN) and silicon oxynitride (SiON).

(12) Others

While not illustrated in FIG. 2, color filters or an upper substrate may be adhered to an upper side of the sealing layer 21 through an adhesive. With the color filters or the upper substrate adhered, it is possible to further protect the hole transport layer 16, the light emitting layer 17, the electron transport layer 18, and the electron injection layer 19 from moisture, air and the like.

3. Method of Manufacturing Organic EL Display Panel 10

The method of manufacturing the organic EL display panel 10 will be described below, referring to the drawings.

FIGS. 3A, 3B, 3C, 3D, 3E, 4A, 4B, 4C, 4D, 5A, 5B, 5C and 5D are schematic sectional views illustrating states in steps in manufacturing the organic EL display panel 10. FIG. 6 is a flow chart illustrating the steps for manufacturing the organic EL display panel 10.

(1) Formation of Substrate 11

Figure 3A:
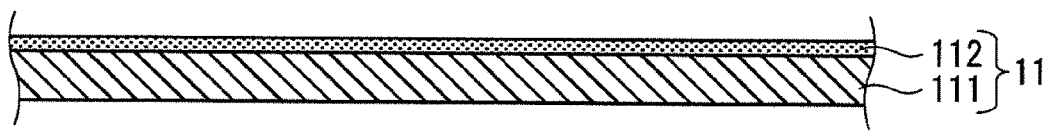
FIGS. 3A, 3B, 3C, 3D and 3E are partial sectional views depicting schematically a manufacturing process of the organic EL element.

First, as illustrated in FIG. 3A, the TFT layer 112 is formed on an upper side of the base material 111 to form the substrate 11 (step S1 in FIG. 6). The TFT layer 112 can be formed by a known method for producing a TFT.

Figure 3B:
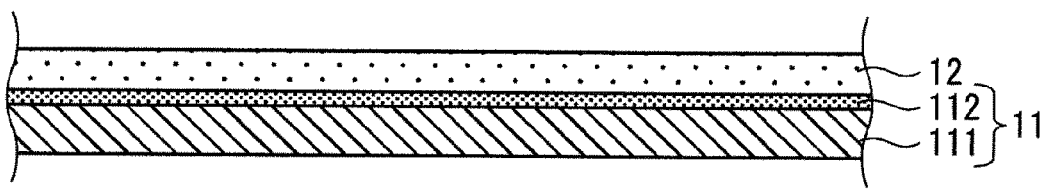

Next, as depicted in FIG. 3B, the inter-layer insulating layer 12 is formed on an upper side of the substrate 11 (step S2 in FIG. 6). Specifically, a resin material having a predetermined fluidity is applied along the upper surface of the substrate 11 in such a manner as to embed the ruggedness on the substrate 11 due to the TFT layer 112, by a die coating method, for example. As a result, the upper surface of the inter-layer insulating layer 12 has a shape flattened along the upper surface of the base material 111.

The inter-layer insulating layer 12 is formed with contact holes (not illustrated) at, for example, parts over source electrodes of TFT elements, by a dry etching method. The contact holes are formed by use of patterning or the like such that surfaces of the source electrodes are exposed at bottom portions of the contact holes.

Next, a connection electrode layer is formed along an inner wall of each contact hole. Part of an upper portion of the connection electrode layer is disposed on an upper side of the inter-layer insulating layer 12. The formation of the connection electrode layer can be performed, for example, by use of a sputtering method. After forming a metallic film, patterning may be carried out using a photolithographic method and a wet etching method.

(2) Formation of Pixel Electrodes 13 and Hole Injection Layers 15

Figure 3C:
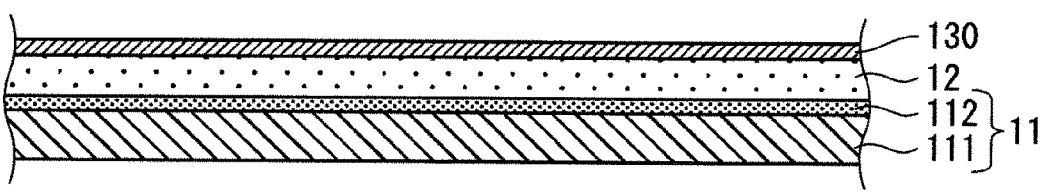

Subsequently, as depicted in FIG. 3C, a pixel electrode material layer 130 is formed on an upper side of the inter-layer insulating layer 12. The pixel electrode material layer 130 can be formed by use of, for example, a vacuum deposition method, a sputtering method or the like.

Figure 3D:
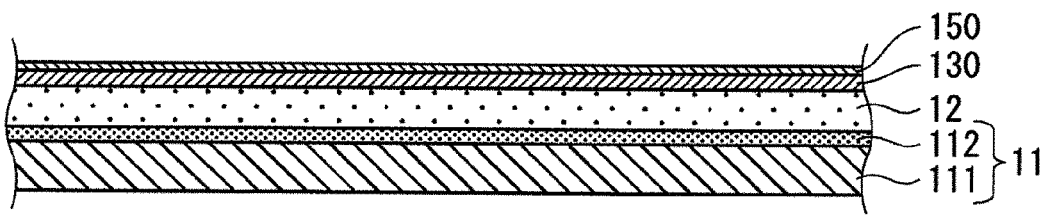

Next, as illustrated in FIG. 3D, a hole injection material layer 150 is formed on an upper side of the pixel electrode material layer 130 (step S4 in FIG. 6). The hole injection material layer 150 can be formed by use of, for example, a reactive sputtering method or the like.

Figure 3E:
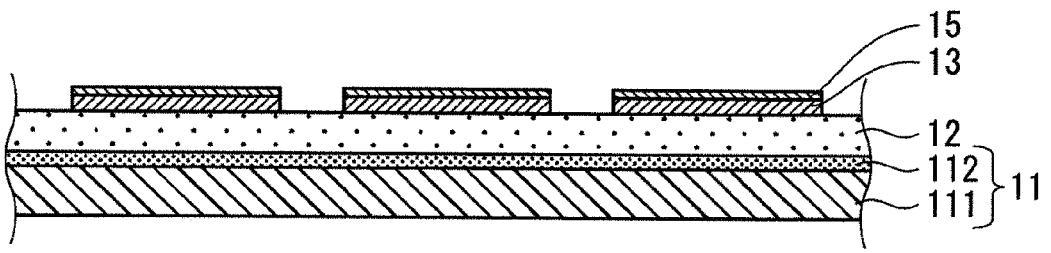

Then, as depicted in FIG. 3E, the pixel electrode material layer 130 and the hole injection material layer 150 are patterned by etching, to form pluralities of pixel electrodes 13 and hole injection layers 15 partitioned on a sub-pixel basis (step S3 in FIG. 6).

Note that the method for forming the pixel electrodes 13 and the hole injection layer 15 is not limited to the aforementioned method; for example, the pixel electrode material layer 130 may be patterned to form the pixel electrodes 13, and thereafter the hole injection layers 15 may be formed.

In addition, the hole injection layers 15 may be formed by a wet process after the banks 14 are formed.

(3) Formation of Banks 14

Figure 4A:
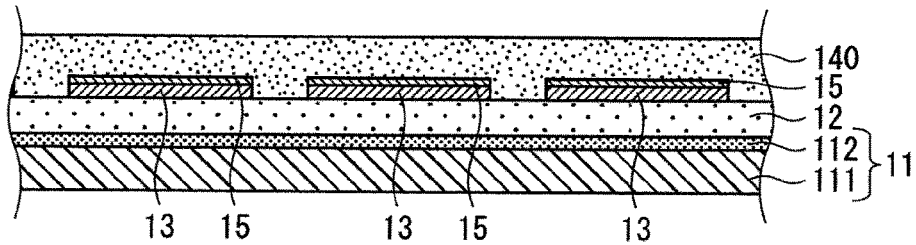
FIGS. 4A, 4B, 4C and 4D are partial sectional views depicting schematically the manufacturing process of the organic EL element following FIGS. 3A, 3B, 3C, 3D and 3E.

Subsequently, as illustrated in FIG. 4A, a bank resin as a material for the banks 14 is applied onto the hole injection layers 15 and the inter-layer insulating layer 12, to form a bank material layer 140. The bank material layer 140 is formed by a method in which a solution prepared by dissolving a phenolic resin as the bank resin in a solvent (for example, a mixed solvent of ethyl lactate and GBL) is uniformly applied onto the hole injection layers 15 and the inter-layer insulating layer 12 by use of spin coating or the like.

Figure 4B:
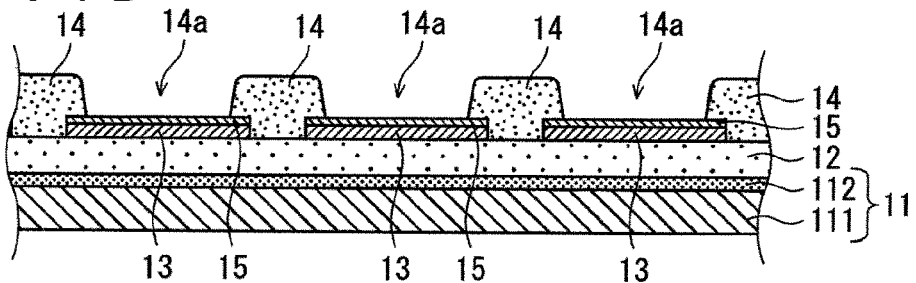

Then, the bank material layer 140 is subjected to pattern exposure and development, to form the banks 14 (FIG. 4B, step S4 in FIG. 6). As a result, the opening areas 14a serving as regions for forming the light emitting layers 17 are defined.

(4) Formation of Hole Transport Layers 16

Figure 4C:
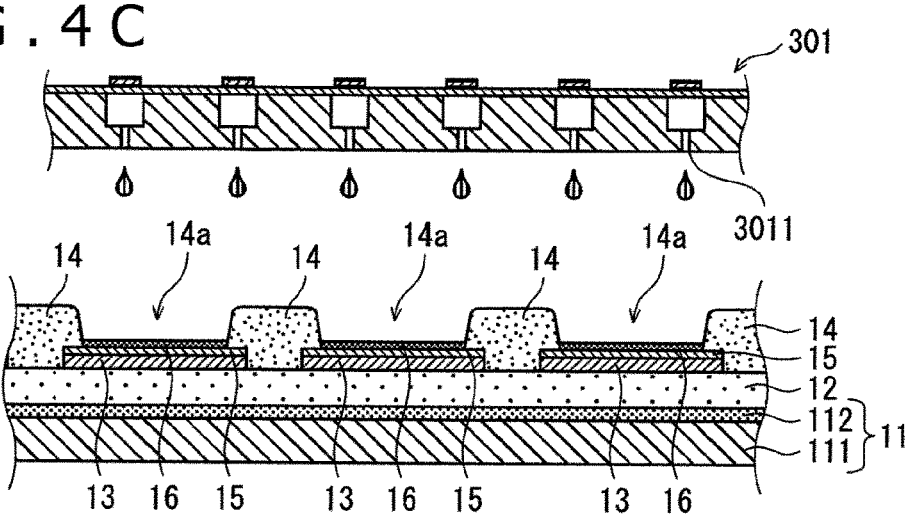

Next, as depicted in FIG. 4C, an ink containing a constituent material for the hole transport layers 16 is ejected to the opening areas 14a defined by the banks 14 from nozzles 3011 of an applying head (coating head) 301 of an applying device (coating device) (described later) to apply the ink onto the hole injection layers 15 in the opening areas 14a, followed by drying, to form the hole transport layers 16 (step S5 in FIG. 6).

(5) Formation of Light Emitting Layers 17

Figure 4D:
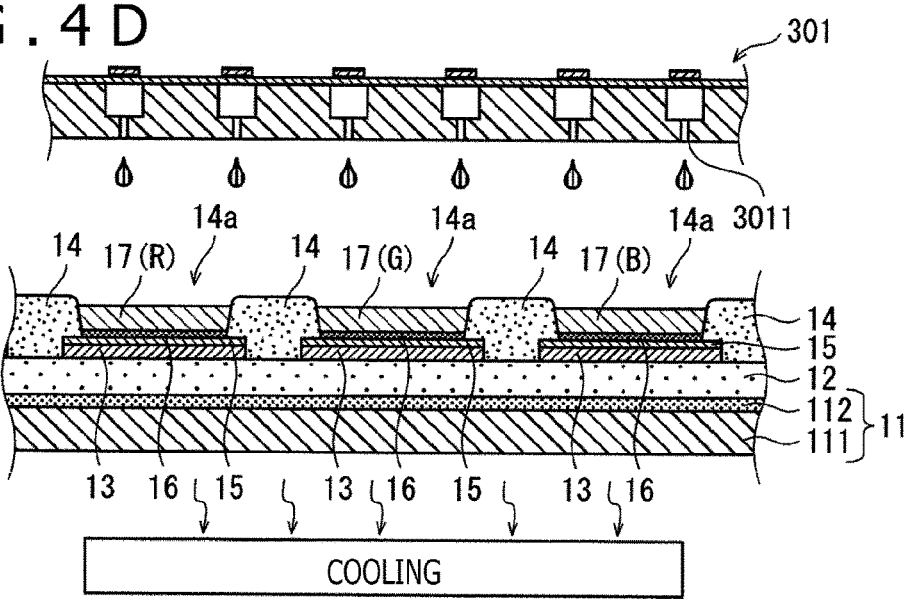

Subsequently, as illustrated in FIG. 4D, inks containing constituent materials for the light emitting layers 17 are ejected from the nozzles 3011 of the applying head 301 to apply the inks to the hole transport layers 16 in the opening areas 14a, followed by drying, to form the light emitting layers 17 (step S6 in FIG. 6).

In the present embodiment, the substrate 11 is preliminarily cooled to a predetermined temperature, whereby the inks applied into the opening areas 14a are rapidly cooled to increase their viscosities, and to restrain convection inside the inks, thereby uniformizing the film thickness of the light emitting layers 17 as much as possible. The details will be described later.

(6) Formation of Electron Transport Layer 18

Figure 5A:
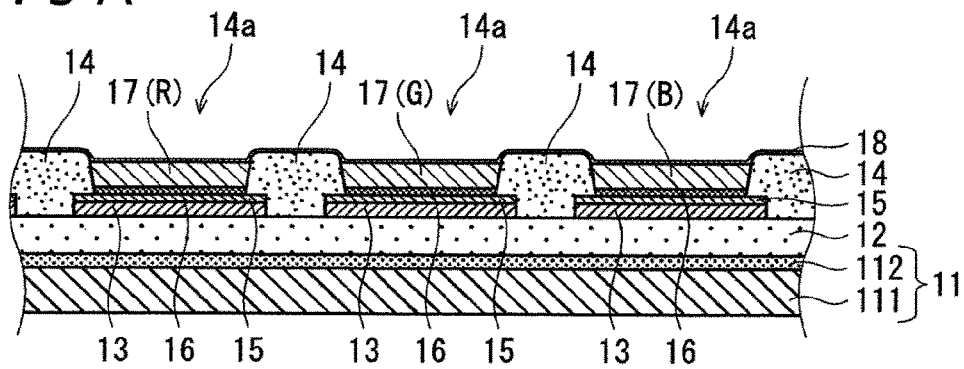
FIGS. 5A, 5B, 5C and 5D are partial sectional views depicting schematically the manufacturing process of the organic EL element following FIGS. 4A, 4B, 4C and 4D.
Figure 6:
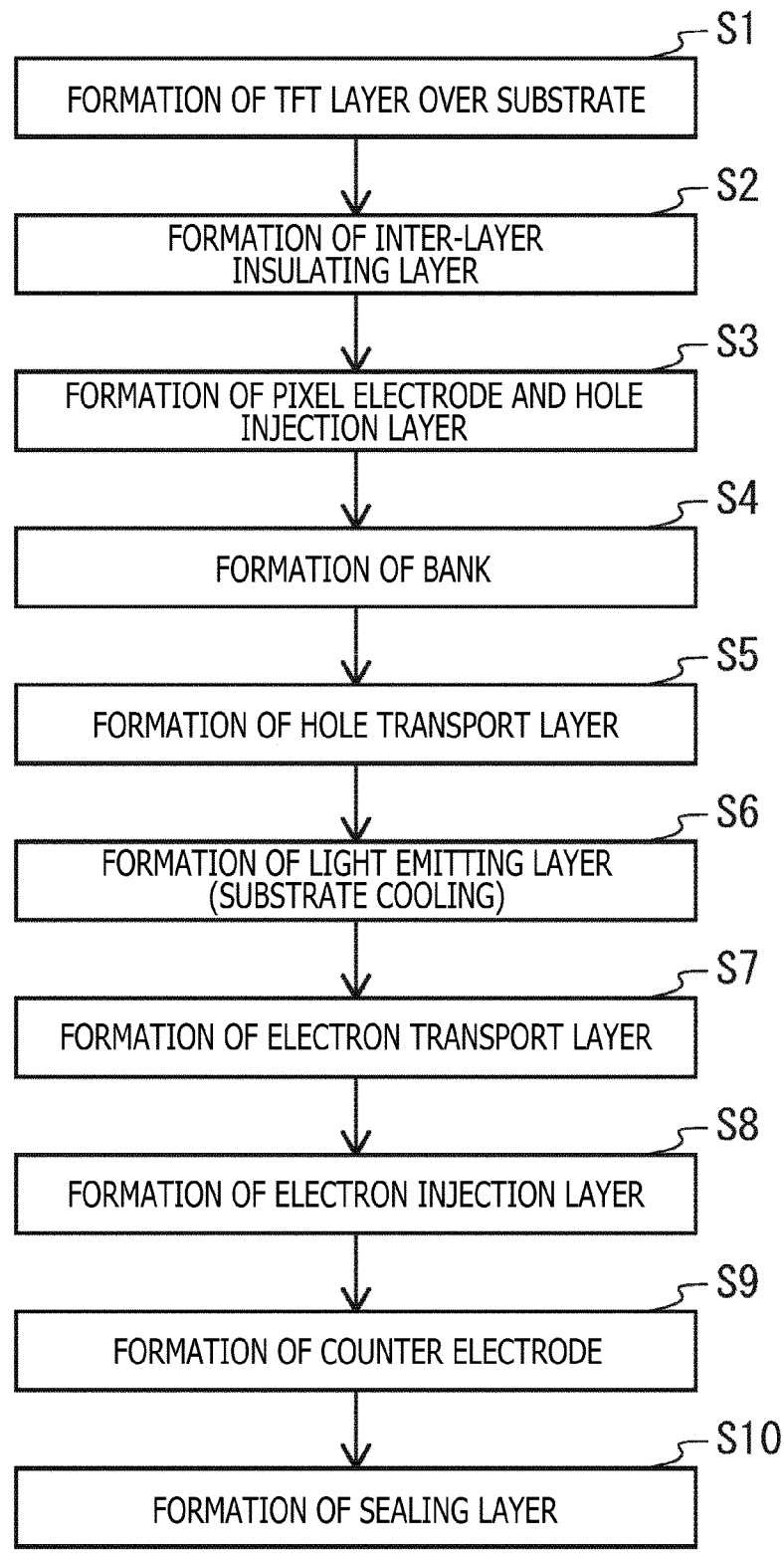
FIG. 6 is a flow chart illustrating the manufacturing process of the organic EL element.

Next, as depicted in FIG. 5A, the electron transport layer 18 is formed on an upper side of the light emitting layers 17 and the banks 14 (step S7 in FIG. 6). The electron transport layer 18 is formed, for example, by a method in which a film of an organic material having an electron transporting property is formed in common for the sub-pixels by vapor deposition.

(7) Formation of Electron Injection Layer 19

Figure 5B:
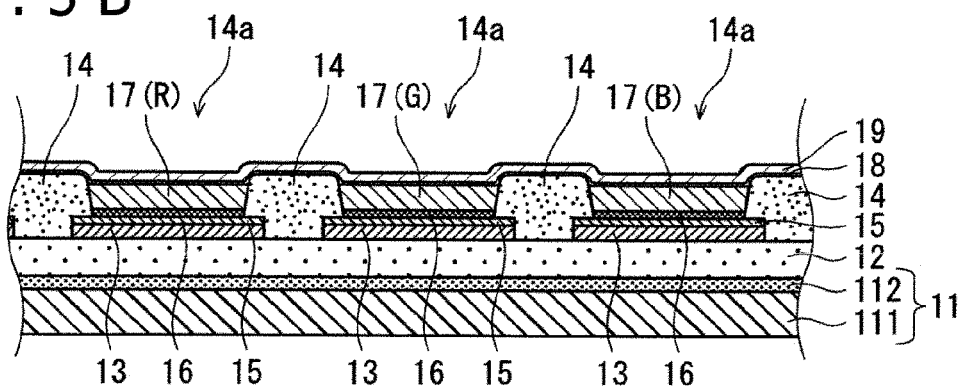

Subsequently, as illustrated in FIG. 5B, the electron injection layer 19 is formed on an upper side of the electron transport layer 18 (step S8 in FIG. 6). The electron injection layer 19 is formed, for example, by a method in which a film of an organic material having an electron transporting property and a doping metal is formed in common for the sub-pixels by vapor codeposition.

(8) Formation of Counter Electrode 20

Figure 5C:
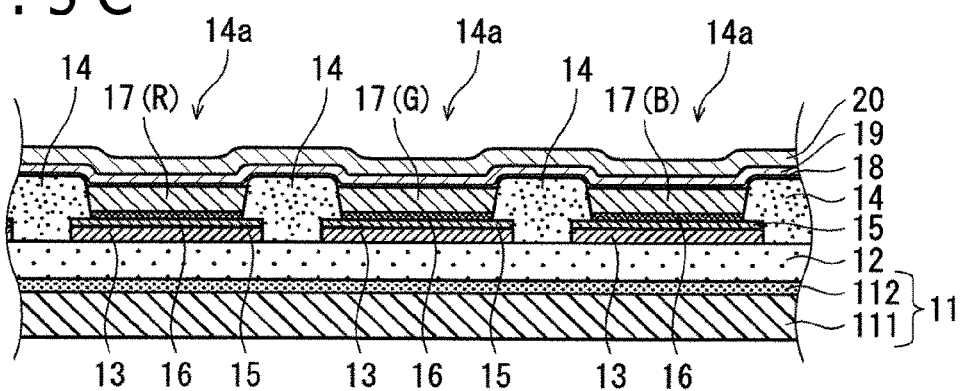

Next, as depicted in FIG. 5C, the counter electrode 20 is formed on an upper side of the electron injection layer 19 (step S9 in FIG. 6). The counter electrode 20 is formed by forming a film of ITO, IZO, silver, aluminum or the like by a sputtering method or a vacuum deposition method.

(9) Formation of Sealing Layer 21

Figure 5D:
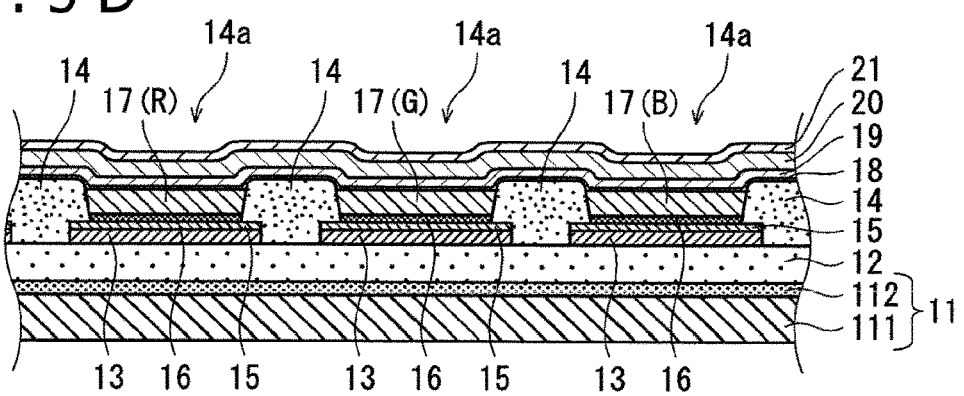

Subsequently, as illustrated in FIG. 5D, the sealing layer 21 is formed on an upper side of the counter electrode 20 (step S10 in FIG. 6). The sealing layer 21 can be formed by forming a film of SiON, SiN or the like by a sputtering method, a chemical vapor deposition (CVD) method or the like.

As a result, the organic EL display panel 10 is completed.

4. Process and apparatus for forming light emitting layer (1) Light Emitting Layer Forming Process FIGS. 7A, 7B and 7C are drawings illustrating schematically a formation process of a light emitting layer by the related art wet process, in which the inter-layer insulating layer 12, the pixel electrodes 13, the hole injection layers 15 and the like are omitted.

As illustrated in FIG. 7A, an ink 170 for forming an organic layer is dropped from the applying head 301 to the opening area 14a on an upper side of the substrate 11, whereon an ink pool 171 is formed in the opening area 14a as depicted in FIG. 7B.

Normally, in this step, the substrate 11 and the ink 170 are at substantially the same temperature as room temperature (on the order of 20° C. to 25° C.).

The ink 170 is formed by dissolving an organic light emitting material in a volatile solvent (organic solvent), as aforementioned, and the solvent is gradually evaporated from the surface of the ink. It is known that the extent of the evaporation is not uniform, and the rate of evaporation is generally higher in end areas (peripheral areas of the surface of the ink pool 171) E close to the banks 14 than in a central area C, of the surface of the ink pool, whereby convection is generated inside the ink pool 171.

Specifically, the specific gravity of each of the organic light emitting material and the solvent is not exactly the same, and, depending on the kinds of them used in combination, the specific gravity of the organic light emitting material is higher than, or lower than, the specific gravity of the solvent. Since the evaporation rate of the solvent varies on a partial basis as above-mentioned, the specific gravity (density) of the ink differs on a partial basis, and the ink portion relatively higher in specific gravity tends to move downward under the gravitational influence. In addition, when a difference is present in the density of the ink, forces for dispersion of particles are also generated in order to uniformize the density. Further, Raileigh convection arising from temperature distribution differences and Marangoni convection arising from surface tension differences are also induced, and as a result of complicated combination of these convections, convections of the ink are generated as exemplarily indicated by thick-line arrows in FIG. 7B.

As a result of generation of such convections, the ink moves along inside surfaces of the banks 14 while being pressed against the inside walls. Moreover, the evaporation rate of the solvent is higher on the outer side of the ink pool 171 (namely, on the side closer to the inside surfaces of the banks 14) as aforementioned. It is considered, therefore, that as depicted in FIG. 7C, the amount of the ink portions dried while adhering to the inside surfaces of the banks 14 increases (rising portions 17b), and, accordingly, the light emitting layer 17 is formed in a state in which a large hollow is generated at a central portion 17a.

Note that the convection directions of the ink indicated by broken-line arrows in FIG. 7B are merely an example; depending on the combination of the organic light emitting material and the solvent and the other conditions, the convection directions of the ink may become reverse to those indicated in FIG. 7B. In any case, since the convections are generated in the applied ink, the amount of the ink portions moving along the inside surfaces of the banks 14 increases, resulting in the problem of non-uniformity of the film thickness as depicted in FIG. 7C.

For this reason, to restrain the convections generated in the ink based on local differences in the evaporation rate of the solvent is an important factor in making uniform the film thickness of the light emitting layer.

In view of this, the present inventor considered to cool the applied ink and thereby to enhance the viscosity of the ink, for the purpose of restraining the convections of the ink.

Figure 8A:
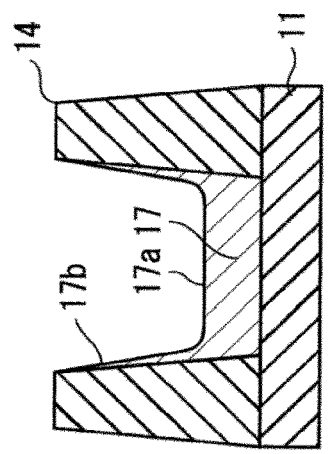
FIGS. 8A, 8B and 8C are schematic drawings for illustrating a formation process of a light emitting layer in a method of manufacturing an organic EL element according to an embodiment of the present disclosure.
Figure 8B:
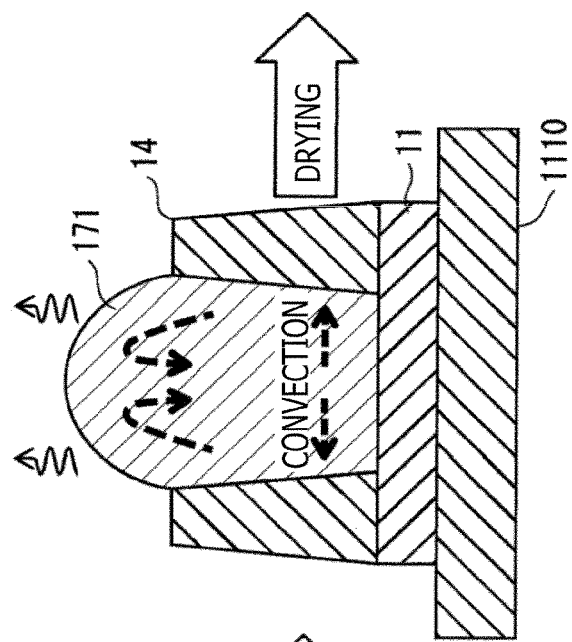
Figure 8C:
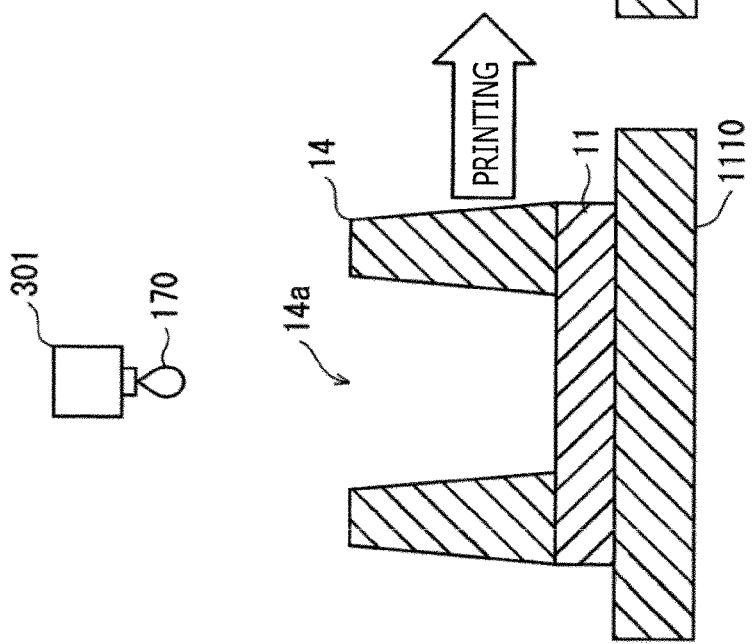

FIGS. 8A, 8B and 8C are schematic drawings for illustrating a formation process of the light emitting layer 17 according to the present embodiment.

First, by use of a cooling plate 1110, the substrate 11 is preliminarily cooled to a temperature (second temperature) lower than the temperature (first temperature) of the ink at the time of application thereof.

An ink 170 is ejected from the applying head 301 toward the opening area 14a over the substrate 11 (FIG. 8A).

From the surface of an ink pool 171, the solvent is evaporated at partially different rates. However, the ink 170 after dropping onto the substrate 11 is cooled through the substrate 11, with the result of a rise in the viscosity thereof, and the evaporation rate of the solvent as a whole is lowered due to the cooling, so that the partial differences in the rate of evaporation from the ink pool 171 are reduced. For this reason, the convection rates are largely suppressed (FIG. 8B), and, as a result, the amount of the ink portions moving downward (or upward) along the inside surfaces of the banks 14 is also reduced. In addition, the drying rate itself on the outer side of the ink pool 171 (the side closer to the inside surfaces of the banks 14) is also lowered due to the cooling.

As a result, the amount of the ink portions dried while adhering the inside surfaces of the banks 14 is also reduced, the width of the rising portions 17b is reduced, and, consequently, the flatness of the central portion 17a is enhanced, and the uniformity of the film thickness is enhanced (FIG. 8C).

Experimental results showed that for suppressing the convection rates of the ink and for obtaining an effect of making the film thickness uniform as compared to that in the related art, it is desirable that the cooled temperature of the ink is lower than the temperature of the ink at the time of application thereof (the temperature at which the ink has a fluidity (low viscosity) suitable for application by the applying device used (in the present embodiment, the kinds and concentrations of the organic material and the solvent in the ink are controlled such that this temperature is room temperature)) by not less than 10° C.

Further, it is desirable to cool the ink after application thereof to a temperature at which the viscosity of the ink is at least two times the viscosity of the ink at the time of application thereof; specifically, it is desirable to cool the applied ink to a temperature equal to or lower than 5° C.

Note that it is considered that as the cooled temperature of the ink is lower, the viscosity of the ink is higher, the convections are restrained more, and a higher effect of uniformizing the film thickness can be obtained. However, cooling the ink more than necessary leads to needless consumption of electric power. In addition, dewing of water vapor in the atmosphere leads to absorption of water in the organic layers such as the light emitting layer, thereby affecting the quality and life of them; therefore, cooling the ink to or below a temperature of dewing should be avoided. Accordingly, the temperature at which dewing is not generated in the relevant atmosphere is the lower limit for the cooling temperature.

In addition, the ink should not be cooled before ejected from the applying head 301. If the viscosity of the ink increases at this state, the nozzle 3011 would be clogged and troubled. In addition, components of the ink would be precipitated to form lumps when the ink is ejected; as a result, the ink does not wettingly spread in the opening area 14a, and it becomes rather difficult to realize uniformization of the film thickness.

(2) Configuration of Light Emitting Layer Forming Apparatus 1000

The configuration of a light emitting layer forming apparatus for forming, by a wet process, the light emitting layer 17 of the organic EL display panel 10 described in FIGS. 8A, 8B and 8C will be described below.

FIG. 9 is a schematic view illustrating the configuration of the light emitting layer forming apparatus 1000 according to the present embodiment.

As illustrated in the drawing, the light emitting layer forming apparatus 1000 includes an ink applying section 1100 for applying an ink 170 containing an organic light emitting material, a carrying section 1200 for carrying a substrate 11 coated with the ink 170, a drying section 1300 for drying in a short time the light emitting layer ink on the substrate 11 carried, and a control section 1400 that controls operations of these sections.

(2-1) Ink Applying Section 1100

A cooling plate 1110 is disposed on a printing stage 1120 of the ink applying section 1100. The substrate 11 is placed on the cooling plate 1110, and the ink 170 is cooled to a temperature (hereinafter referred to also as "convection restraining temperature") lower than the temperature at the time of application thereof (in the present embodiment, room temperature (20° C. to 25° C.)). The convection restraining temperature is set to 5° C. in the present embodiment.

Note that this light emitting layer forming step is desirably performed in a low-humidity environment (dry environment) such that dewing of water vapor in the atmosphere will not occur even at the set convection restraining temperature. More ideally, a dry environment such that a dew point temperature is equal to or lower than −30° C. (relative humidity is equal to or lower than 1%).

Figure 10:
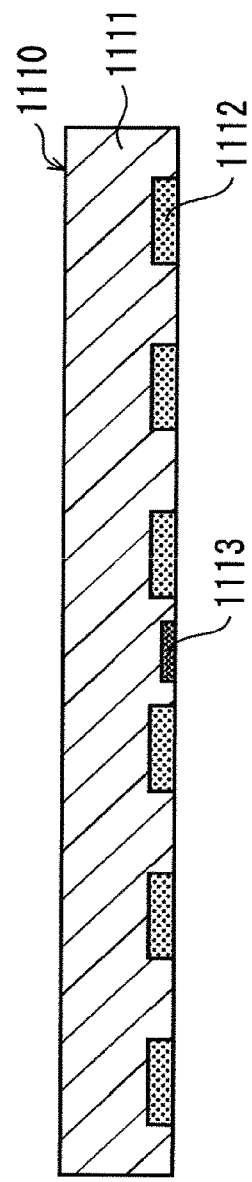
FIG. 10 is a schematic sectional view depicting an example of the configuration of a cooling plate.

FIG. 10 is a schematic vertical sectional view depicting the configuration of the cooling plate 1110.

The cooling plate 1110 includes a base plate 1111 formed using a material high in thermal conductivity, such as a metal, and a plurality of thermoelectric conversion elements 1112, such as Peltier elements, arranged at a back surface of the base plate 1111 in a matrix in plan view and in a state in which heat absorbing surfaces thereof are in contact with the back surface of the base plate 1111, such that the base plate 1111 is entirely cooled to a uniform temperature. If the cooled temperature of the substrate 11 is uneven, the substrate 11 might be deformed.

Back surfaces (heat radiating surfaces) of the thermoelectric conversion elements 1112 are in contact with an upper surface of the printing stage 1120 (FIG. 9). The printing stage 1120 is formed using a material high in thermal conductivity, whereby the property of heat radiation from the back surfaces of the thermoelectric conversion elements 1112 is enhanced, and efficient cooling can be realized.

In addition, the base plate 1111 is additionally provided with a temperature sensor 1113 for monitoring the temperature of the base plate 1111. The control section 1400 controls electric power supplied to the thermoelectric conversion elements 1112, based on a detection output from the temperature sensor 1113, to thereby maintain the base plate 1111 in a state of being cooled to a target convection restraining temperature.

Other cooling plates 1210 and 1310 are quite the same as the cooling plate 1110 in configuration.

Figure 12:
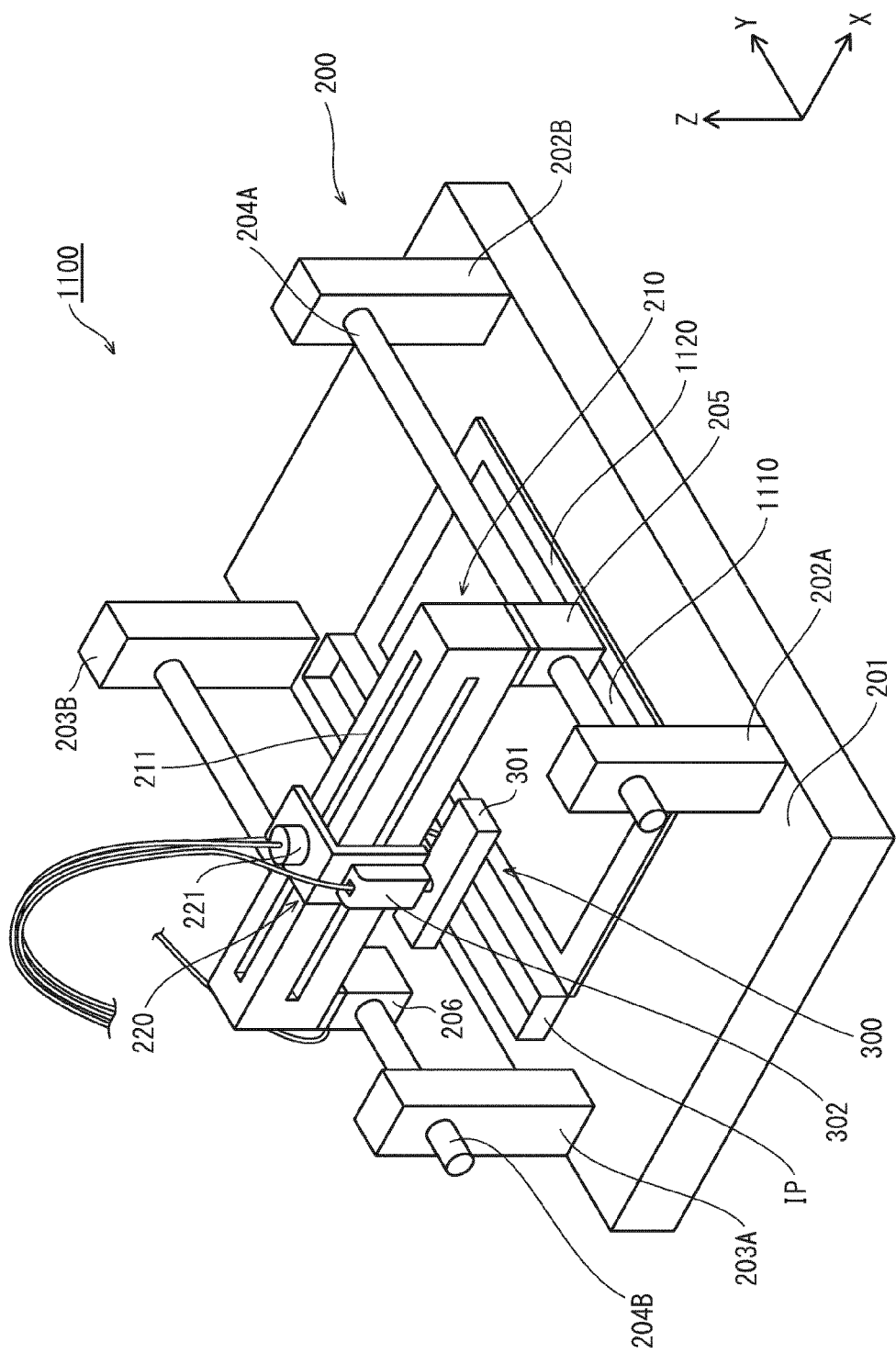
FIG. 12 is a perspective view depicting the configuration of an ink applying section in the light emitting layer forming apparatus.

FIG. 12 is a drawing depicting a main configuration of an applying device as an example of the ink applying section 1100. As illustrated in the drawing, the applying device includes an ink applying table 200 and a head section 300.

(a) Ink Applying Table

As depicted in FIG. 12, the ink applying table 200 is a so-called gantry type operating table, in which a gantry section (moving frame) is disposed such as to be movable on an upper side of a table as a base along a pair of guide shafts.

In a specific configuration, columnar stands 202A, 202B, 203A, and 203B are erectly provided at four corners of an upper surface of a plate-shaped base 201. The printing stage 1120 and the cooling plate 1110 placed thereon are disposed in an inside region surrounded by the stands 202A, 202B, 203A, and 203B, and the substrate to be coated with an ink is placed on the cooling plate 1110. In addition, an ink pan (dish-shaped vessel) IP for stabilizing ejection characteristics by ejecting the ink immediately before application of the ink is also disposed.

The stands 202A and 202B and the stands 203A and 203B hold the guide shafts 204A and 204B in parallel to the longitudinal (Y) direction of the base 201.

In addition, the gantry section 210 is held on the guide shafts 204A and 204B through linear motors 205 and 206.

With this configuration, at the time of driving of the applying device, the pair of linear motors 205 and 206 are driven, whereby the gantry section 210 is slidably reciprocated along the longitudinal direction (Y-axis direction) of the guide shafts 204A and 204B.

A carriage 220 including an L-shaped pedestal is disposed on the gantry section 210. A servo motor 221 is disposed on the carriage 220, and a gear (not illustrated) is attached to a tip of a driving shaft of the motor. The gear is in mesh with a minute-pitch rack formed in a guide groove 211 formed along the longitudinal direction (X direction) of the gantry section 210. Attendant on driving of the servo motor 221, the carriage 220 is precisely moved in a reciprocal manner along the X-axis direction by a so-called pinion-rack mechanism.

A head section 300 is mounted to the carriage 220. The head section 300 can be scanned with respect to the substrate serving as an object to be coated with an ink, by moving the gantry section 210 along the longitudinal direction of the guide shafts 204A and 204B in a state in which the carriage 220 is fixed relative to the gantry section 210, and by moving the carriage 220 along the longitudinal direction of the gantry section 210 in a state in which the gantry section 210 is stopped. A main scanning direction of the head section 300 is a row (Y-axis) direction, and a sub-scanning direction is a column (X-axis) direction.

(b) Head Section

The head section 300 adopts a known piezoelectric system, and includes the applying head 301 and a main body section 302. The applying head 301 is fixed to the carriage 220 through the main body section 302. The main body section 302 incorporates a servo motor therein, and moves the applying head 301 in the vertical direction (Z-axis direction).

The applying head 301 is provided with a plurality of nozzles 3011 (not illustrated in FIG. 12; see FIG. 4D, etc.) at a surface (ejection surface) facing a fixed stage ST, and the nozzles 3011 are arranged in a row along the longitudinal direction of the applying head 301. The ink or inks supplied to the applying head 301 are ejected as droplets from the nozzles 3011 toward the substrate serving as an object to be coated.

The droplet ejecting operation of each nozzle 3011 is controlled by a driving voltage given to the piezoelectric element provided at each nozzle 3011. By controlling the driving signal given to each piezoelectric element from the control section 1400 (FIG. 9), the droplet is ejected from each nozzle 3011.

(2-2) Carrying Section 1200

Returning to FIG. 9, the carrying section 1200 includes a carrying stage 1220, the cooling plate 1210 disposed on the carrying stage 1220, and a belt conveyor device 1230 that carries the cooling plate 1210 and the carrying stage 1220 toward the drying section 1300.

Naturally, a configuration may be adopted in which the carrying stage 1220 is moved along guide rails using other carrying device such as a pneumatic actuator, a hydraulic actuator or a linear motor, as a drive source, in place of the belt conveyor device 1230.

(2-3) Drying Section 1300

The drying section 1300 has a configuration in which a stage 1320 with the cooling plate 1310 placed thereon is disposed in an airtight vacuum drying chamber 1330. A door (not illustrated) is opened, the substrate 11 carried by the carrying section 1200 is placed on the cooling plate 1310, the door is closed, and the air (gas) pressure is lowered by a vacuum pump (not illustrated) to establish a vacuum state or a state close to vacuum. By this, evaporation of the solvent in the ink is accelerated, and complete drying can be achieved in a short time.

Since the substrate 11 is being cooled by the cooling plate 1310 also during the drying step, the ink can be dried in a state in which the ink is at a low temperature and little convection is occurring in the ink, whereby further uniformization of ink film thickness can be realized.

(2-4) Control Section 1400

Figure 11:
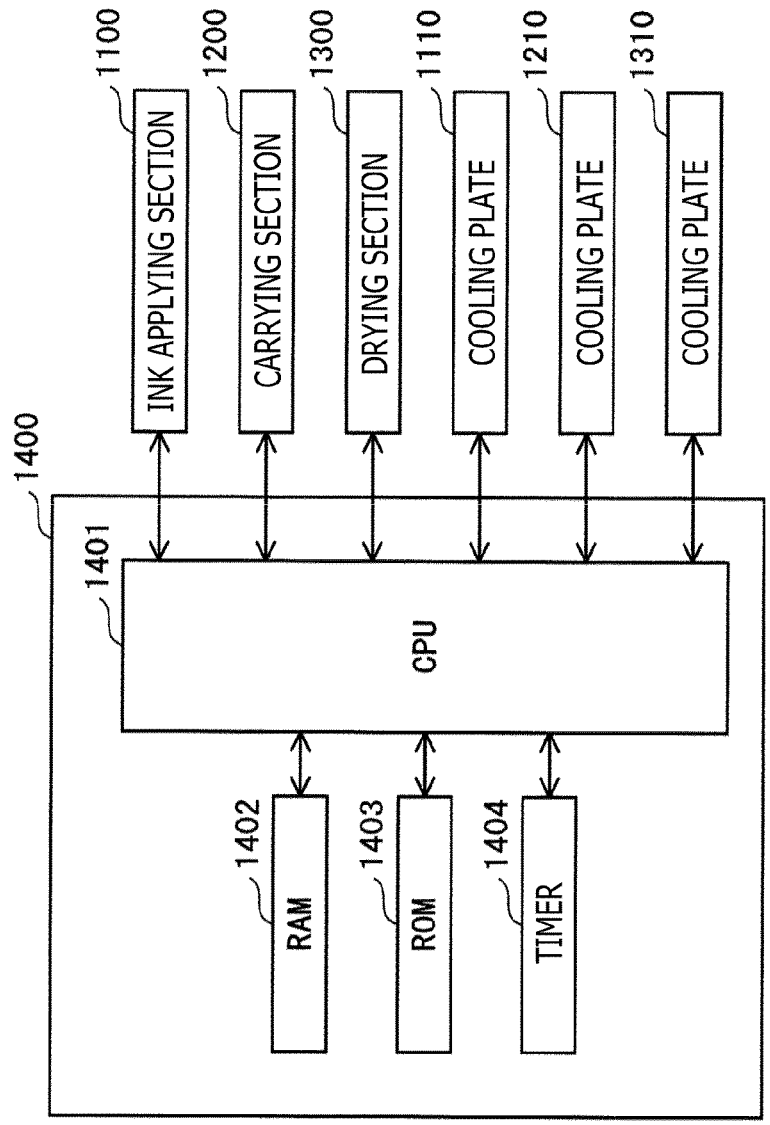
FIG. 11 is a block diagram illustrating the configuration of a control section of the light emitting layer forming apparatus.

FIG. 11 is a block diagram depicting a main configuration of the control section 1400 in the light emitting layer forming apparatus 1000.

As illustrated in the diagram, the control section 1400 includes a central processing unit (CPU) 1401, a random access memory (RAM) 1402, a read only memory (ROM) 1403, a timer 1404 and the like.

The CPU 1401 reads a program for forming a light emitting layer from the ROM 1403 upon, for example, turning-on of a power supply to the light emitting layer forming apparatus 1000, executes the program using the RAM 1402 as a working storage region, and controls the ink applying section 1100, the carrying section 1200, and the drying section 1300, to smoothly perform a light emitting layer forming operation. In addition, the timer 1404 is for management of treatment time in each step.

The control section 1400 is particularly supplied with detection signals from the temperature sensors in the cooling plates 1110 to 1310 (cooling sections), and adjusts the quantities of electric power supplied to the respective thermoelectric conversion elements, thereby controlling each of the cooling plates 1110 to 1310 to the convection restraining temperature.

Figure 13:
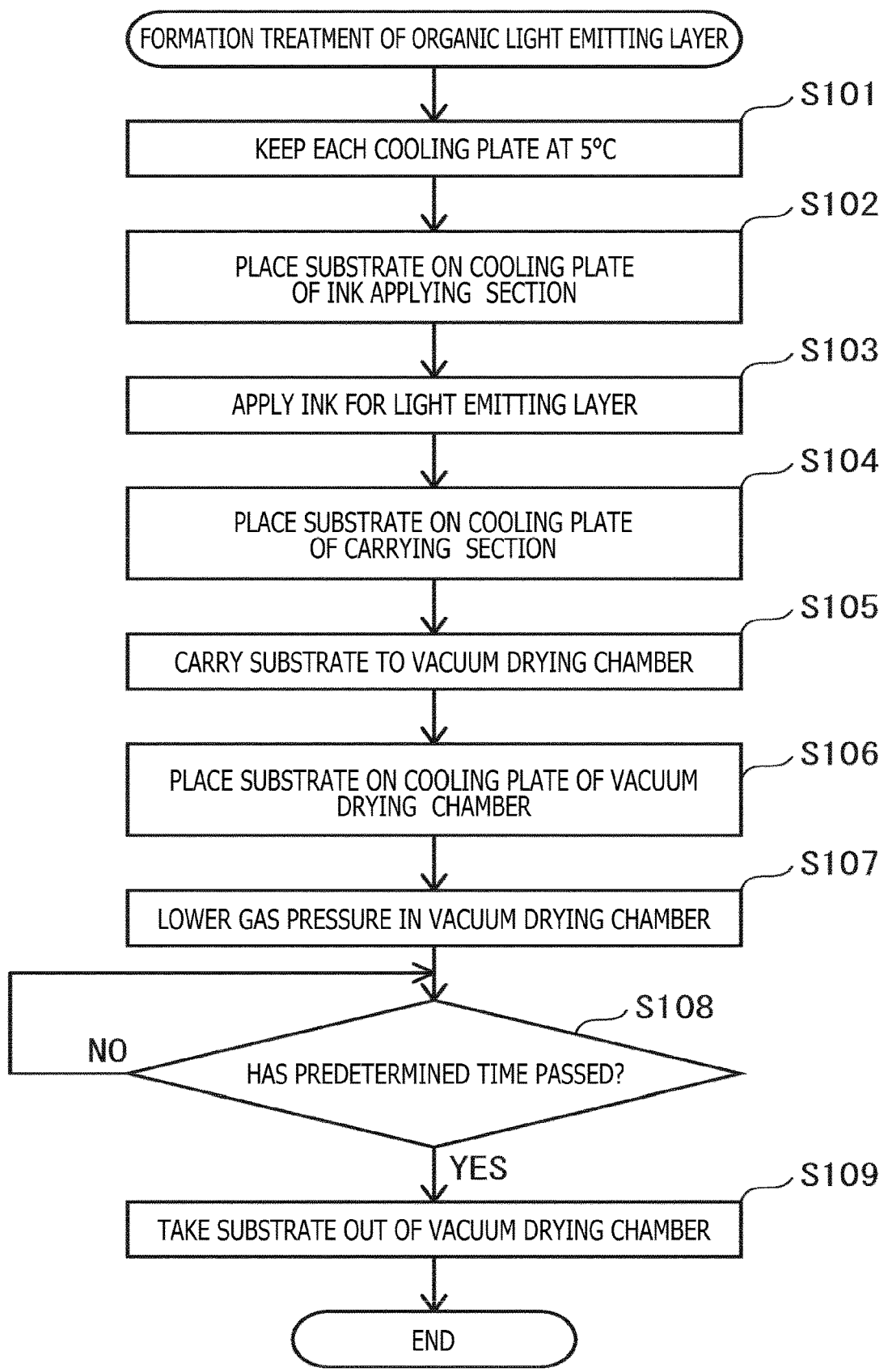
FIG. 13 is a flow chart illustrating the contents of control of the control section in the light emitting layer forming apparatus.

(2-5) Contents of control by control section 1400 in light emitting layer forming step FIG. 13 is a flow chart depicting the contents of control carried out in the light emitting layer forming step by the control section 1400.

First, the cooling plates 1110 to 1310 of the ink applying section 1100 are cooled to and maintained at 5° C., which is the convection restraining temperature (step S101).

The substrate 11 is placed on the cooling plate 1110 of the ink applying section 1100 by a transfer device such as a robot hand, for example (step S102). Since the substrate 11 itself is very thin, the substrate 11 and the inter-layer insulating layer 12 thereon and the like having been in a room-temperature state are cooled down to 5° C. by the cooling plate 1110 within a few seconds.

Then, the applying head 301 is scanned, to apply the inks 170 for colors to the substrate 11 in a pre-programmed pattern (step S103).

When the application of the inks 170 is completed for all the pixels, the substrate 11 is placed onto the cooling plate 1210 of the carrying section 1200 by a transfer device similar to the above-mentioned (step S104), and is carried to the vacuum drying chamber 1330 in the drying section 1300 (step S105).

The substrate 11 is placed onto the cooling plate 1310 of the drying section 1300 by a transfer device (step S106).

A vacuum pump is operated to lower the gas pressure inside the vacuum drying chamber 1330 of the drying section 1300 to a predetermined value (step S107). Then, while counting time by the timer 1404, the substrate 11 is left to stand in the vacuum drying chamber 1330 for a time previously determined by experiments or the like (step S108: YES), to completely dry the light emitting layer or layers 17, after which the substrate 11 is taken out of the vacuum drying chamber 1330 (step S109), and the light emitting layer forming step is completed.

Note that the above-mentioned contents of control are merely an example, and the contents of the present disclosure are not limited thereto.

For instance, while the cooling plates 1110 to 1310 as the cooling sections have been simultaneously cooled to 5° C. in the step S101 above, all the cooling plates may not necessarily set to the same temperature, insofar as the temperatures are within the range of the convection restraining temperature. In addition, the cooling may be started not simultaneously but sequentially, insofar as the cooling is in time with respect to each of the applying step, the carrying step, and the drying step. It is to be noted, however, that for eliminating variabilities among the products, the management of ink temperature after application thereof is extremely important, and it is desirable to perform such a control as to lower the temperature of each cooling plate to the target convection restraining temperature by the time the substrate is placed on the cooling plate, and to maintain the cooling plate at that temperature.

In addition, a configuration may be adopted in which the substrate 11 together with the cooling plate 1110 is carried from the ink applying section 1100 to the control section 1400. In this case, the cooling plates 1210 and 1310 can be omitted.

(3) Verification

Figure 14:
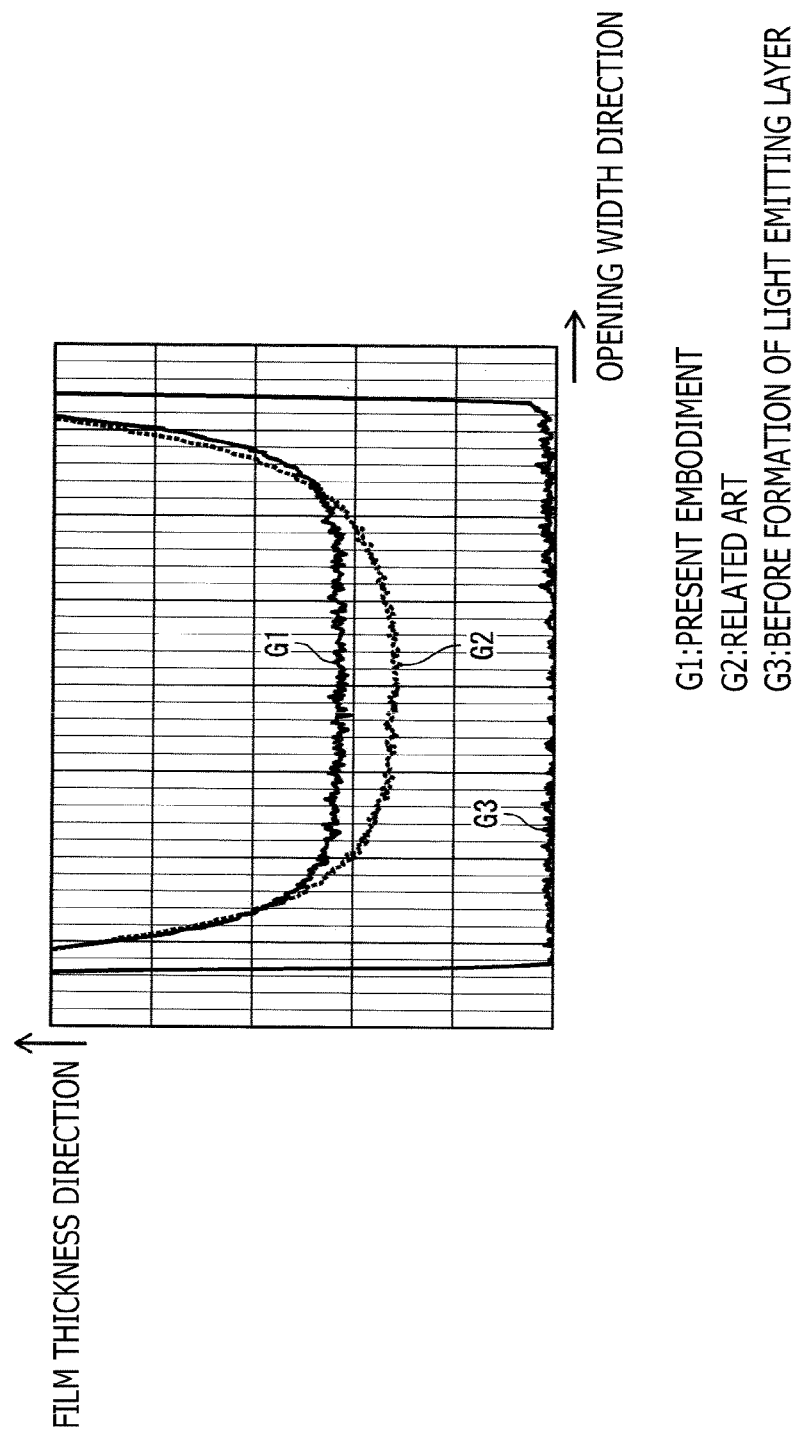
FIG. 14 is a graph depicting a film shape of a light emitting layer formed by a film forming step according to an embodiment of the present disclosure, in comparison with a film shape obtained by the related art film forming step.

FIG. 14 is a graph depicting a film shape of a light emitting layer formed by the light emitting layer forming step according to the present embodiment, in comparison with a film shape obtained by the related art step.

The axis of ordinates in the graph represents the height in the film thickness direction of the light emitting layer in the unit of nanometers (nm), while the axis of abscissas represents the position of the opening area 14$a$ (see FIG. 2) in the opening width direction in the unit of micrometers (μm). Note that measurement was conducted using an atomic force microscope (AFM).

Graph G1 represents a surface shape of the light emitting layer 17 when the ink at room temperature was applied in the opening area 14$a$, the ink was thereafter cooled to 5° C., and was dried in the cooled state. Note that the viscosity of the ink at 5° C. is approximately two times the viscosity of the ink in the room-temperature state before ejection thereof, whereby the convections inside the ink are largely restrained.

In addition, graph G2 represents a surface shape of the light emitting layer 17 in the case where the ink was dried directly at room temperature without cooling, like in the related art. Graph G3 represents a surface shape of the substrate before application of the ink thereto.

As is clear from comparison of graph G1 with graph G2, the light emitting layer formed by the manufacturing method according to the present embodiment shows less recess in a central portion, and an enlarged flat portion, indicating enhanced film thickness uniformity, as compared to the related art base.

Note that due to the trend toward higher resolution of the organic EL display panel, the width of pixel (the width of the opening area 14$a$) is reduced to, for example, approximately 5 to 30 μm, and, for pattern printing with higher resolution by an applying device, it is desirable to enhance the fluidity of the ink. In this case, the proportion of the solvent in the ink is increased, and convections in the ink become more liable to occur. For this reason, the film thickness uniformizing effect obtained by restraining the convections in the ink through the cooling as above-described can be expected further.

5. Effects

As aforementioned, according to the present embodiment, the following effects are obtained.

(1) With the ink cooled after application thereof, the viscosity of the ink is increased, convections inside the ink are restrained, and the evaporation rate of the solvent at the outside of the applied ink is lowered. As a result, the amount of the ink portion dried while moving along the side surfaces of the banks is reduced, so that the rising portions at the bank side surfaces are lessened, the extent of recessing at a central portion is lowered accordingly, and uniformization of the film thickness of the light emitting layer is promoted, as compared to the related art manufacturing method. Consequently, an improvement in light emission efficiency, an enhancement of quality of images displayed, and an elongation of useful life are realized.

(2) Since the ink is cooled after application thereof, the possibility of a trouble generated in the applying device is absent, and the ink materials which have been used hitherto can be used as they are.

(3) Note that Japanese Patent Laid-Open No. 2014-225432 mentioned above as the related art discloses a configuration in which an ink applied to a substrate is heated simultaneously with or immediately after the application thereof, and thereafter the surface of the applied ink is irradiated with ultraviolet (UV) rays to temporarily cure the ink surface, followed by cooling.

In this related art, since the ink is first heated, the convections inside the applied ink are promoted. In addition, since the surface of the ink after application thereof has a central portion raised upward by surface tension, as depicted in FIG. 7B of the present application, irradiation with UV rays in this state to effect temporary curing may not be said to uniformize the ink film thickness. Besides, although the substrate is cooled after irradiation with UV rays, the document does not disclose at all about the extent to which the temperature of the heated ink is to be lowered. In other words, in the related art, it is not understood at all that the major cause of the nonuniformity of the film thickness of the ink film formed by the wet process is the convections inside the applied ink; thus, there are clear differences in configuration and effect between the related art and the present application.

Modifications

While the embodiment of the organic EL display panel and the method of manufacturing the organic EL display panel has been described above as a mode of the present disclosure, the present disclosure is not limited by the above description at all, except for the essential characteristic configuration elements thereof. Modifications as other modes of the present disclosure will be described below.

(1) The method of forming the light emitting layer 17 in the above embodiment is also applicable to the case of forming other organic layers by a wet process. In that case, it is sufficient to use an apparatus the same as the light emitting layer forming apparatus 1000 in configuration as an organic layer forming apparatus, and to use an ink according to the function of the organic layer to be formed.

Note that examples of the organic layer which can be formed by the wet process according to the above embodiment include the hole transport layer, the hole injection layer, the electron transport layer, and the electron injection layer, in addition to the light emitting layer. At least one of these organic layers is formed by the above embodiment, whereby it is possible to provide an organic EL display panel of higher quality as compared to the related art, while reducing the manufacturing cost.

(2) Also in the case of so-called all-over coating, instead of applying the ink in the opening area between the banks as in the case of the light emitting layer described above, the evaporation rate of the solvent is not uniform at end portions and the central portion of the ink application surface, and convections are necessarily generated inside the ink, to hinder uniform ization of the ink film thickness; therefore, the film thickness uniformizing effect is obtained by cooling the ink after the ink application and by the time the ink is dried.

Figure 15:
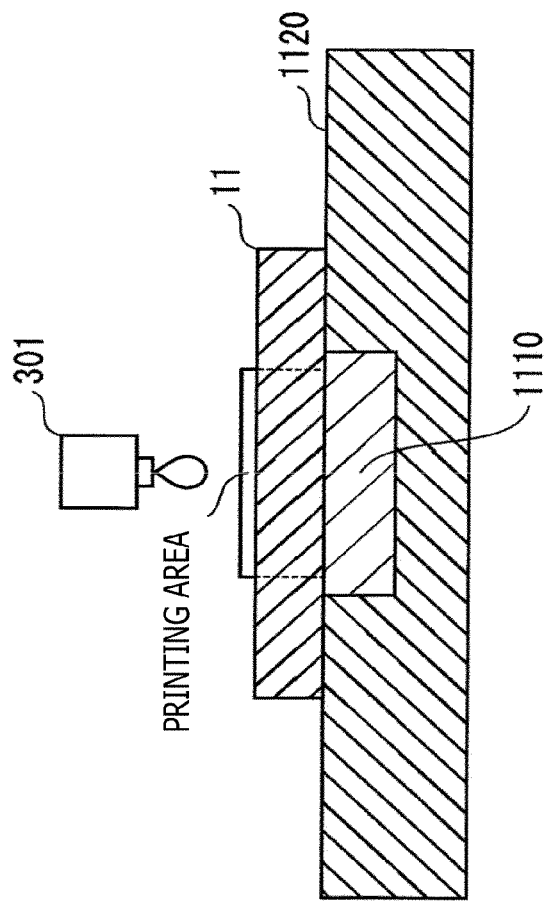
FIG. 15 is a drawing illustrating a modification of the range of cooling by the cooling plate in the light emitting layer forming apparatus.

(3) While the whole area of the back surface of the substrate 11 has been cooled by the cooling plate 1110 as illustrated in FIG. 9 in the above embodiment, this is not limitative. As depicted in FIG. 15, only that part of the substrate 11 which corresponds to the printing area (the area where to form the organic EL element; note that in the case where dummy regions are provided in the periphery of the organic EL element in a screen display region, as disclosed in Japanese Patent Laid-Open No. 2012-252983, for example, it is desirable that the printing area includes the dummy regions) may be cooled.

In addition, while the cooling plate 1110 has had a configuration in which the base plate 1111 is cooled by the thermoelectric conversion elements 1112, other configuration may also be adopted insofar as the cooling device can cool to a target temperature. For example, a configuration may be adopted in which the base plate 1111 is provided therein with a cavity, and a cooled liquid or gas is circulated in the cavity to perform cooling. The cooling of the liquid or gas to be circulated in the cavity is conducted by a cold storage or a cooling device utilizing a known cooling cycle used for air conditioners (a cycle in which a refrigerant is liquified by condensation by a compressor, is then decompressed into an easily evaporable state, and is evaporated to cause removal of heat).

Further, a configuration may also be adopted in which a base plate 1111 having a high heat capacity is preliminarily cooled separately by storage in a cold storage room, and replacement of the base plate is conducted as required.

The same as above applies also to the other cooling plates 1210 and 1310. Note that a configuration may also be adopted in which the substrate 11 is formed therein with a thermoelectric conversion module similar to the Peltier element by a photolithographic method or the like, such that the substrate 11 itself constitutes a cooling section. Furthermore, it may become possible in the future to form thermoelectric conversion modules in the banks.

(4) While the substrate has been placed on the cooling plate to cool the ink applied over the substrate in the above embodiment, cooling may be conducted by other method than this.

Figure 16:
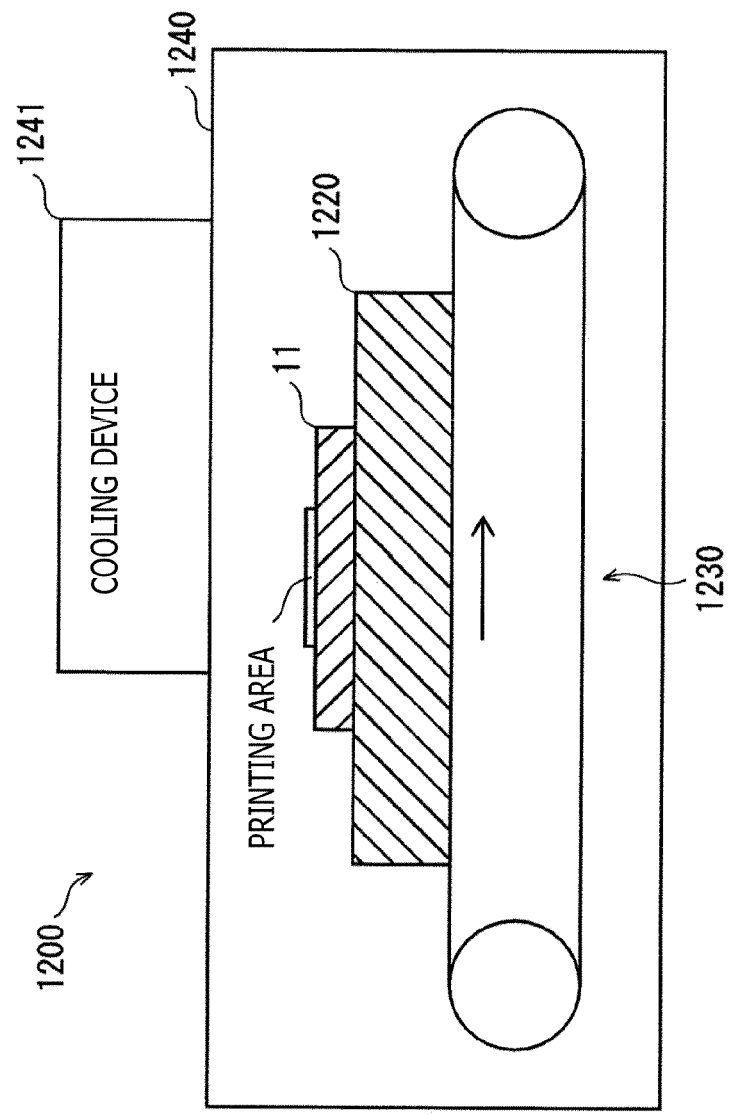
FIG. 16 is a drawing depicting a modification of a cooling structure in a carrying section of the light emitting layer forming apparatus.

For example, an accommodation chamber 1240 for accommodating the whole body of the carrying stage 1220 and the belt conveyor device 1230 as depicted in FIG. 16 may be provided in the carrying section 1200, and the atmosphere inside the accommodation chamber 1240 may be cooled by a cooling device 1241 utilizing the above-mentioned cooling cycle.

Figure 17:
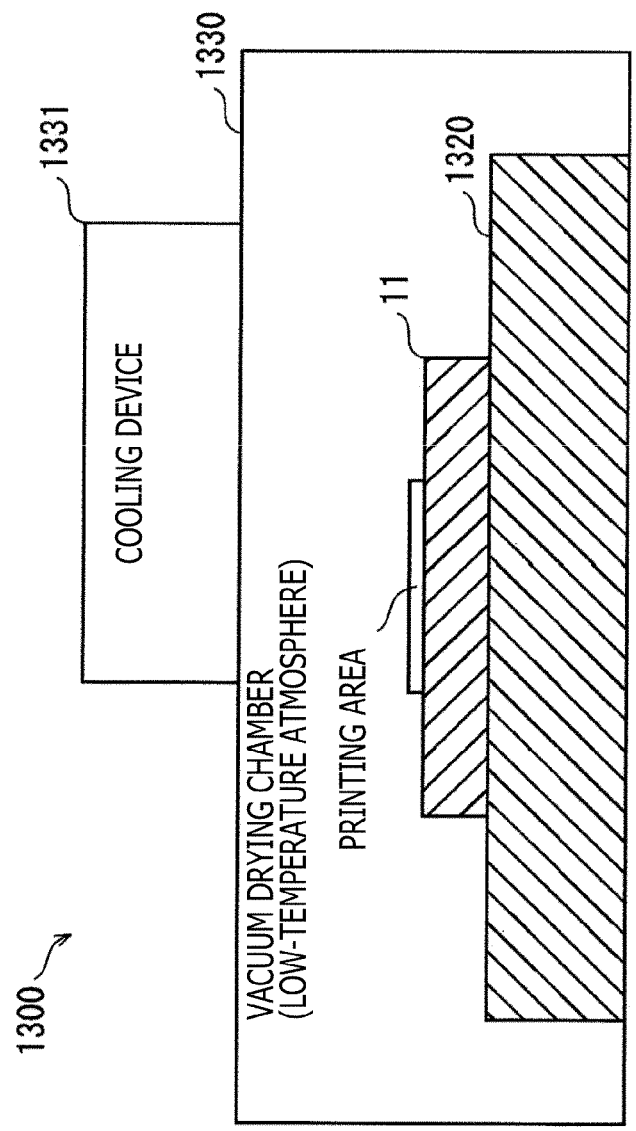
FIG. 17 is a drawing illustrating a modification of a cooling structure in a drying section of the light emitting layer forming apparatus.

Similarly, as illustrated in FIG. 17, in the drying section 1300, the atmosphere inside the vacuum drying chamber 1330 may be cooled by a cooling device 1331.

Other than the above, any measure that can cool the applied ink to the convection restraining temperature may be used, without any particular limitation as to the configuration or layout thereof.

(5) In the above embodiment, the ink applied over the substrate has been cooled in all of the applying step in the ink applying section 1100, the carrying step in the carrying section 1200, and the drying step in the drying section 1300. However, the cooling of the ink may be conducted in at least one of these steps. Where the ink temperature is made to be lower than the temperature at the time of ink application is ensured at any stage in the course from the ink application to the ink drying, it is thereby possible to restrain convections of the ink, at least as compared to the related art, which contributes to uniformization of the film thickness of the organic layer.

It is to be noted, however, that in the drying section 1300, the cooling may not necessarily be conducted until the applied ink is completely dried. After the lapse of such a time that the ink is dried to some extent and convections influencing the ink film thickness are considered not to be generated, it is unnecessary to forcibly cool the ink any more. This lapse of time can be preliminarily determined by experiments or the like.

(6) In the step of forming the banks 14 (step S4 in FIG. 6), further, the surfaces of the banks 14 may be subjected to a surface treatment with an organic solvent or the like or to a plasma treatment. By this, a repellent property is imparted to the surfaces of the banks 14, and the amount of the ink adhering to the side surfaces of the banks 14 is reduced, whereby enhanced uniformity of the film thickness of the light emitting layer 17 can be expected.

(7) In the above embodiment, the organic EL display device is of the top emission type and the cathode therein is the counter electrode. However, the anode may be the counter electrode, and the cathode may be the pixel electrode. In addition, the organic EL display device may be of the bottom emission type.

(8) Besides, while a configuration in which the organic EL element 1 includes the electron transport layer 18, the electron injection layer 19, the hole injection layer 15, and the hole transport layer 16 has been adopted in the above embodiment, this is not restrictive. For instance, an organic EL element not having the electron transport layer 18, or an organic EL element not having the hole transport layer 16 may also be adopted. In addition, for example, a hole injection/transport layer as a single layer may be provided in place of the hole injection layer 15 and the hole transport layer 16. Besides, for instance, an intermediate layer formed using an alkali metal may be provided between the light emitting layer 17 and the electron transport layer 18.

(9) In the above embodiment, the light emitting layer forming apparatus 1000 has been provided with the drying section 1300 including the vacuum drying device. However, the vacuum drying device is not indispensable. Where there is time-basis room in the manufacturing line, the drying may be conducted in an atmospheric-pressure atmosphere during the carrying to a next-stage device.

(10) In the method of manufacturing the organic EL display panel according to the present disclosure, the substrate and the like are cooled, and, in this instance, thermal strain may be generated and the substrate and the like may be deformed. Therefore, it is desirable to use organic materials whose thermal expansion coefficients are as low as possible, as the materials for the substrate, the inter-layer insulating layer, the banks and the like.

(11) A dispenser type applying device or other printing device that ejects ink continuously onto the substrate can be used as the ink applying device in the above embodiment.

(12) While the active matrix system has been adopted for the organic EL display panel in the above embodiment, this is not limitative, and a passive matrix system may also be adopted. In addition, the organic EL display panel is not limited to a so-called pixel bank system in which the banks are formed in a grid pattern such as to surround each pixel, and the organic EL display panel may be of a line bank system in which the banks are formed in the form of lines. It is to be noted, however, that in view of the fact that adhesion of the ink to the bank side surfaces due to convections is a main cause of the nonuniform ink film thickness, the organic EL display panel of the pixel bank system is more advantageous in order that the effect of adoption of the manufacturing method according to the present disclosure is produced more assuredly.

<<Supplement>>

While the method and apparatus for manufacturing an organic EL display panel according to the present disclosure have been described above based on the embodiment and modifications, the present disclosure is not limited to the above embodiment and modifications. Modes obtained by applying various modifications conceived by those skilled in the art to the above embodiment and modifications, and modes realized by arbitrarily combining the components and functions of the embodiment and modifications without departing from the scope of the gist of the present disclosure, are also included in the present disclosure.

The present disclosure is applicable to a method of manufacturing an organic EL display panel in which an applying device (coating device) is used, and the like.

The present disclosure contains subject matter related to that disclosed in Japanese Priority Patent Application JP 2018-043376 filed in the Japan Patent Office on Mar. 9, 2018, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A method of manufacturing an organic electroluminescence display panel in which a plurality of organic electroluminescence elements each including an organic layer are arranged on an upper side of a substrate, the method comprising:
    applying an ink obtained by one of dissolving or dispersing an organic material in a solvent, to a preset application area over the substrate; and
    cooling, simultaneously with the applying, the applied ink within a period until the applied ink is dried, to lower an ink temperature to a second temperature lower than a first temperature of the ink at a time of application thereof.

2. The method of manufacturing the organic electroluminescence display panel according to claim 1,
    wherein the second temperature is lower than the first temperature by not less than 10° C.

3. The method of manufacturing the organic electroluminescence display panel according to claim 1,
    wherein the second temperature is equal to or lower than 5° C.

4. The method of manufacturing the organic electroluminescence display panel according to claim 1, further comprising:
    carrying, after the cooling of the applied ink, the substrate coated with the applied ink to a later-stage device; and
    cooling, when the substrate is carried to the later-stage device, the applied ink that is cooled simultaneously with the applying.

5. The method of manufacturing the organic electroluminescence display panel according to claim 1, further comprising:
    carrying, after the cooling of the applied ink, the substrate from a position at which the ink is applied in the applying to a drying section;
    drying, in the drying section, the applied ink that is colled simultaneously with the applying; and cooling, during the drying in the drying in the drying section, the applied ink that is cooled simultaneously with the applying.

6. The method of manufacturing the organic electroluminescence display panel according to claim 5, wherein the drying section is a vacuum drying device.

7. The method of manufacturing the organic electroluminescence display panel according to claim 1, wherein the organic layer includes at least one of an organic light emitting layer, a hole injection layer, a hole transport layer, an electron injection layer, or an electron transport layer.

8. An apparatus for manufacturing an organic electroluminescence display panel in which a plurality of organic electroluminescence elements each including an organic layer are arranged on an upper side of a substrate, the apparatus comprising:
   an applying section configured to apply an ink obtained by one of dissolving or dispersing an organic material in a solvent, to a preset application area over the substrate; and
   a cooling section configured to cool, simultaneously with the application of the ink, the applied ink within a period until the applied ink is dried, to lower an ink temperature to a second temperature lower than a first temperature of the ink at a time of application thereof.

9. The apparatus for manufacturing the organic electroluminescence display panel according to claim 8, wherein the second temperature is lower than the first temperature by not less than 10° C.

10. The apparatus for manufacturing the organic electroluminescence display panel according to claim 8, wherein the second temperature is equal to or lower than 5° C.

11. The apparatus for manufacturing the organic electroluminescence display panel according to claim 8, further comprising a carrying section configured to carry, after the applied ink is cooled simultaneously with the application of the ink, the substrate coated with the applied ink to a later-stage device,
   wherein the applied ink that is cooled simultaneously with the application of the ink is further cooled during when the substrate is carried by the carrying section to the later-stage device.

12. The apparatus for manufacturing the organic electroluminescence display panel according to claim 8, further comprising:
   a drying section; and
   a carrying section configured to carry, after the applied ink is cooled simultaneously with the application of the ink, the substrate from the applying section to the drying section, wherein
   the drying section is configured to dry the applied ink that is cooled simultaneously with the application of the ink, and
   the applied ink that is cooled simultaneously with the application of the ink is further during when the applied ink that is cooled simultaneously with the application of the ink is dried by the drying section.

13. The apparatus for manufacturing the organic electroluminescence display panel according to claim 12, wherein the drying section includes a vacuum drying device.

14. The apparatus for manufacturing the organic electroluminescence display panel according to claim 8, wherein the organic layer includes at least one of an organic light emitting layer, a hole injection layer, a hole transport layer, an electron injection layer, or an electron transport layer.

* * * * *